(12) United States Patent
Nozawa

(10) Patent No.: US 8,258,038 B2
(45) Date of Patent: Sep. 4, 2012

(54) METHOD OF MANUFACTURING SEMICONDUCTOR MEMORY

(75) Inventor: Katsuya Nozawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/076,526

(22) Filed: Mar. 31, 2011

(65) Prior Publication Data

US 2011/0177666 A1 Jul. 21, 2011

Related U.S. Application Data

(63) Continuation of application No. PCT/JP2010/004708, filed on Jul. 23, 2010.

(30) Foreign Application Priority Data

Aug. 3, 2009 (JP) ................................. 2009-180296

(51) Int. Cl.
*H01L 21/02* (2006.01)
*H01L 21/20* (2006.01)

(52) U.S. Cl. ................. 438/382; 257/E21.004; 438/104

(58) Field of Classification Search .................. 438/382, 438/104; 257/E21.004, E45.002
See application file for complete search history.

(56) References Cited

U.S. PATENT DOCUMENTS

| | | | |
|---|---|---|---|
| 5,155,657 A | 10/1992 | Oehrlein et al. | |
| 5,532,182 A | 7/1996 | Woo | |
| 5,834,357 A | 11/1998 | Kang | |
| 6,078,493 A | 6/2000 | Kang | |
| 6,190,964 B1 | 2/2001 | Winters | |
| 6,211,531 B1 * | 4/2001 | Nakazato et al. | 257/28 |
| 7,598,555 B1 * | 10/2009 | Papworth Parkin | 257/295 |
| 2005/0167699 A1 | 8/2005 | Sugita et al. | |
| 2006/0160304 A1 | 7/2006 | Hsu et al. | |
| 2007/0167008 A1 | 7/2007 | Hsu et al. | |
| 2008/0308784 A1 * | 12/2008 | Oh et al. | 257/4 |

(Continued)

FOREIGN PATENT DOCUMENTS

JP 7-202028 8/1995

(Continued)

OTHER PUBLICATIONS

International Search Report issued Oct. 26, 2010 in International (PCT) Application No. PCT/JP2010/004708.

*Primary Examiner* — William D Coleman
*Assistant Examiner* — Christine Enad
(74) *Attorney, Agent, or Firm* — Wenderoth, Lind & Ponack, L.L.P.

(57) ABSTRACT

The method of manufacturing a semiconductor memory includes a process of forming a projection by performing an insulator forming process on the exposed side surface of a reactive conductive material and a non-reactive conductive material that are stacked above a substrate so as to change a predetermined length of the side surface of the reactive conductive material into an insulator, and thereby causing the side surface of the non-reactive conductive material to project outward from the side surface of the reactive its conductive material. The insulator forming process is an oxidation process or a nitridation process, the reactive conductive material is a material that reacts chemically and changes into the insulator in the oxidation process or nitridation process, and the non-reactive conductive material is a material that does not change into the insulator in the oxidation process or nitridation process.

13 Claims, 24 Drawing Sheets

U.S. PATENT DOCUMENTS

| | | |
|---|---|---|
| 2009/0096568 A1 | 4/2009 | Hosoi et al. |
| 2009/0102598 A1* | 4/2009 | Yamazaki et al. ............. 338/20 |
| 2009/0140243 A1* | 6/2009 | Kim et al. ..................... 257/43 |
| 2009/0200640 A1 | 8/2009 | Hosoi et al. |
| 2009/0230458 A1 | 9/2009 | Ishiduki et al. |

FOREIGN PATENT DOCUMENTS

| | | |
|---|---|---|
| JP | 8-078628 | 3/1996 |
| JP | 8-167702 | 6/1996 |
| JP | 11-040762 | 2/1999 |
| JP | 2000-049303 | 2/2000 |
| JP | 2006-203178 | 8/2006 |
| JP | 2007-109821 | 4/2007 |
| JP | 2007-180473 | 7/2007 |
| JP | 2008-159760 | 7/2008 |
| JP | 2009-224466 | 10/2009 |
| JP | 2009-290050 | 12/2009 |
| WO | 2005/041303 | 5/2005 |

* cited by examiner

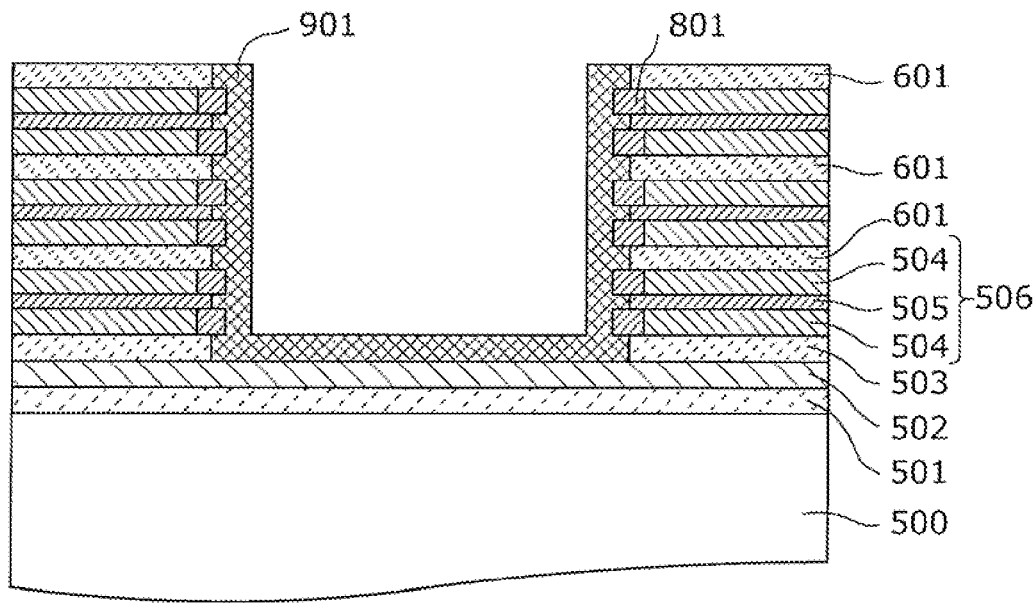
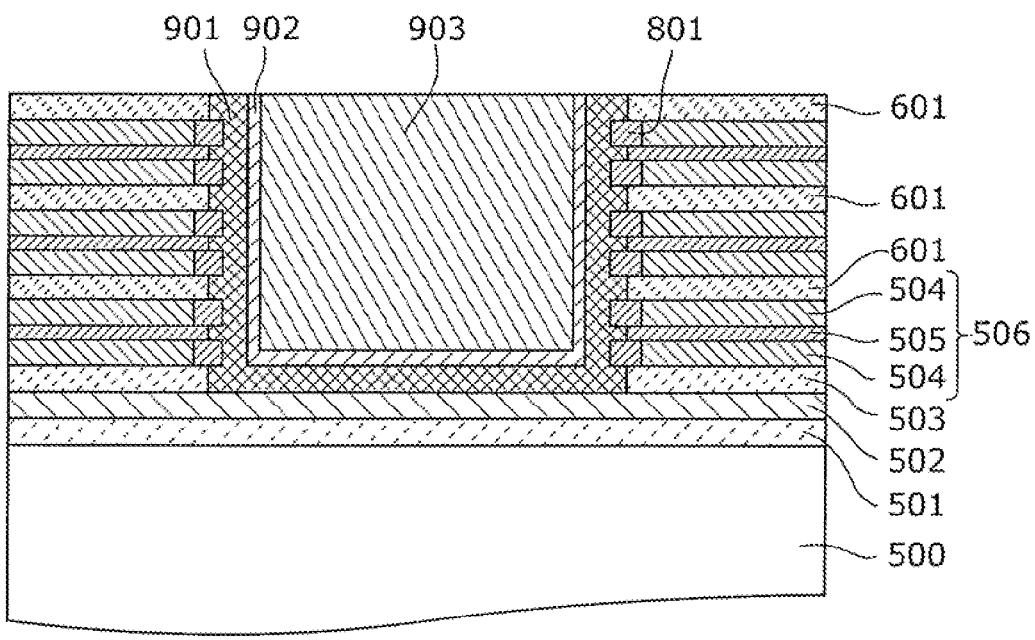

Non-polar ReRAM operational characteristics

Bipolar ReRAM operational characteristics

US 8,258,038 B2

METHOD OF MANUFACTURING SEMICONDUCTOR MEMORY

CROSS REFERENCE TO RELATED APPLICATION

This is a continuation application of PCT application No. PCT/JP2010/004708 filed on Jul. 23, 2010, designating the United States of America.

BACKGROUND OF THE INVENTION (1) Field of the Invention

The present invention relates to a method of manufacturing a semiconductor memory in which information is stored by applying voltage and causing current to flow between electrodes to induce a change of state.

(2) Description of the Related Art

Currently, two types of memories, namely, Dynamic Random Access Memories (DRAMs) and flash memories, are widely used as large-scale integrated storage elements.

DRAMs are what are called volatile memories which allow fast writing and reading but require power consumption for memory retention. Therefore, DRAMs are mainly used in short-term memories such as the main memory, and the like, of a computer. Flash memories are what are called nonvolatile memories which do not require power consumption for memory retention. These storage elements have the drawback of low-speed information writing and rewriting, and are thus mainly used in long-term memories for digital cameras and music players.

If a storage element which allows large-scale integration and has both high-speed and non-volatility can be put into practical use, the need to use separate elements for short-term memories and long-term memories would be eliminated. Using such an element would enable the realization of computers, and the like, that can be used immediately after power is switched ON. In view of this, significant research geared towards the realization of storage elements which allow large-scale integration and have both high-speed and non-volatility is currently being carried out.

It is considered that overcoming the drawbacks of DRAMS and flash memories to realize a large-scale integrated non-volatile high-speed memory would require a memory having a structure and operating principle that are different from DRAMS and flash memories. At present, research on memories of various structures and operating principles is widely being carried out. These include the Resistance Random Access Memory (ReRAM) and spin-injection Magnetic Resistance Random Access Memory (MRAM).

Both ReRAMs and spin-injection MRAMs are devices having two electrodes. A common point between these devices is that information is stored as a difference in the electrical resistance between electrodes. Furthermore, these devices also share in common the point that writing, rewriting, and reading of information is performed by applying voltage between the electrodes.

The characteristic features of each of these memories shall by described below.

(ReRAM)

FIG. 21 is an outline structure diagram showing the structure of a ReRAM. As shown in FIG. 21, the ReRAM is an element having a structure in which a variable resistance film 2102 is disposed between two electrodes 2101 and 2103. Information is held as a difference of electrical resistance between the electrodes. In the case of a 1-element, 1-bit memory which is the most basic configuration, the two electrical resistance states of low-resistance state and high-resistance state are assigned to correspond to the information 0 and 1 (or 1 and 0) respectively. Writing/rewriting of information is performed by causing the electrical resistance between the electrodes to change to the electrical resistance value corresponding to the information. In other words, this is the act of lowering the electrical resistance or increasing the electrical resistance.

There are two types of ReRAMs, namely, the non-polar and the bipolar, depending on how electrical resistance changing is induced.

FIG. 22 is a graph showing operational characteristics of a non-polar ReRAM. As shown in FIG. 22, in the case of the non-polar type, transition from the high-resistance state to the low-resistance state is induced by applying voltage that is greater than a threshold voltage. This is one type of what is called a dielectric breakdown phenomenon. Transition from the low-resistance state to the high-resistance state is also induced by applying voltage that is greater than a certain voltage. However, a voltage 2201 with which the transition from the low-resistance state to the high-resistance state occurs, is a voltage 2202 which is lower than the transition from the high-resistance state to the low-resistance state. In the case of m the non-polar type, because of the difference in the resistance state of the element prior to transition, merely having the two types of transition threshold voltages makes it possible to induce either of the transitions, from high resistance to low resistance or from low resistance to high resistance, by voltage application in the same direction.

FIG. 23 is a graph showing operational characteristics of a bipolar ReRAM. As shown in FIG. 23, in the case of the bi-polar type, the inducing of transition to the low-resistance state by applying a voltage that is greater than the threshold voltage is the same as with the non-polar type. What is different is that the application direction of the voltage 2301 which induces the transition from high resistance to low resistance, and the application direction of the voltage 2302 which induces the transition from low resistance to high resistance are reversed. In other words, transition between states is controlled by separately applying voltages of two types, namely positive and negative, between the two electrodes.

In both cases of the non-polar type and the bipolar type, the electrical resistance of the element does not change even when a voltage that is lower than the threshold for effecting a transition in resistance state is applied to between the electrodes. Therefore, the electrical resistance value, that is, the stored information can be read without being destroyed, by applying a voltage that satisfies this condition and causing current to flow between the electrodes.

(Spin-Injection MRAM)

FIG. 24 is a diagram showing the structure of an MRAM. As shown in FIG. 24, the MRAM has a structure in which a thin-tunnel insulating film 2403 made of MgO and so on is disposed between two electrodes 2401 and 2402 which are made from a ferromagnet. In the same manner as the ReRAM, information is held as a difference of electrical resistance between the electrodes. Specifically, the two electrical resistance states of the low-resistance state and the high-resistance state are assigned to correspond to the information 0 and 1 (or 1 and 0) respectively. Writing/rewriting of information is performed by causing the electrical resistance between the electrodes 2401 and 2402 to change to the electrical resistance value corresponding to the information. In other words, this is the act of lowering the electrical resistance or increasing the electrical resistance.

In the MRAM, the electrical resistance is determined by the magnetic orientations of both electrodes 2401 and 2402. Resistance decreases when the magnetic orientations of the two electrodes 2401 and 2402 are parallel, and increases when the orientations are antiparallel. Normally, rewriting of information is performed by keeping the magnetic orientation of one of the electrodes fixed, and reversing the magnetic orientation of the other.

The spin-injection MRAM, which among MRAMs has a particularly suitable scheme for miniaturization, is characterized by performing this magnetic reversal by current injection. When the magnetic orientation is to be made parallel, a current that is greater than the threshold current is caused to flow from the side of the fixed-magnetization electrode towards the variable-magnetization electrode. Furthermore, when magnetic orientation is to be made anti-parallel, a current that is greater than the threshold current is caused to flow, conversely, from the side of the variable-magnetization electrode towards the fixed-magnetization electrode.

Since magnetic reversal does not occur at the threshold current or below, adjusting voltage so as to limit current to be equal to or less than the threshold current allows the electrical resistance, that is, information to be read, without destroying the stored information.

(Lowering Power Consumption)

Like the ReRAM and the spin-injection MRAM, in the case of a device in which writing/rewriting of information is performed by inducing resistance change through application of voltage and current injection between electrodes, direct current is generated with each writing or rewriting, and thus power is consumed. Therefore, there is a demand for the reduction of the power consumption of the device by lowering the voltage and amount of current needed for inducing resistance change.

(Variation)

Furthermore, with these devices, suppression of characteristics-variation is important. In the case of a storage element in which the writing and rewriting of information is performed by inducing resistance change between electrodes by applying voltage and causing current to flow between the electrodes, the electrical resistance needs to be detected for the reading of information. For this reason, it is necessary to apply voltage and cause current to flow between the electrodes.

However, when the applied voltage exceeds the threshold voltage in the ReRAM, or the current exceeds the threshold current in the spin-injection MRAM, unintended rewriting of information (destruction of information) occurs. Therefore, the voltage applied and the amount of current flowing at the time of information reading needs to be controlled so as to be equal to or less than the threshold. However, when the threshold is different among elements, there is the concern of a voltage or current that was not a problem in one element causing the destruction of information in another element.

Furthermore, if there are variations in the resistance values in the low-resistance state and the high-resistance state in each element, it becomes difficult to judge whether each element is in the low-resistance state or the high-resistance state, and thus information cannot be read well. Therefore, in addition to controlling the voltage and amount of current needed for writing/rewriting, it becomes necessary to control the variation in element characteristics such as the resistance value for the low-resistance state and the resistance value for the high resistance state (hereinafter denoted simply as "variation control").

(Methods for Power Consumption Reduction and Variation Control)

Two methods, namely, a method of forming a projection on an electrode, and a method of partially coating the surface of an electrode using an insulator, are well known as effective techniques for power consumption reduction and variation control.

The projection formed on the electrode causes electric charges to crowd in that part. As such, it is possible to start the flow of current using a lower voltage. Furthermore, since the probability that current will flow out from the projection is high, variations in current path can be suppressed. As such, the advantageous effect of suppressing element characteristic variation can be obtained. On the other hand, the length of the projection has very little to do with such effect.

Meanwhile, partial insulation coating of the electrode surface has the advantageous effect of limiting the current path to the portion that is not coated with the insulator. As such, current density rises in the uncoated vicinity of the electrode, and thus facilitating the occurrence of a change of state even with a lower amount of current. In other words, it becomes possible to rewrite information using a smaller amount of current. This advantageous effect is mainly an effect that is obtained after current starts to flow. Furthermore, since there is the advantageous effect of suppressing current path variation as in the projection, an element characteristic variation suppressing effect can also be obtained.

Although the forming of a projection on the electrode and the partial insulation coating of the electrode have partially overlapping functions as described above, these functions are not exactly the same. Therefore, the greatest advantageous effect can be obtained with a structure in which a projection is formed on the electrode and the entirety of the portion other than the projection is coated with an insulator.

International Publication No. 2005/041303 (Patent Reference 1), Japanese Unexamined Patent Application Publication No. 2006-203178 (Patent Reference 2), U.S. Pat. No. 5,155,657 Specification (Patent Reference 4), and Japanese Unexamined Patent Application Publication No. 2007-109821 (Patent Reference 6) disclose a method of forming a projection on an electrode. Furthermore, Patent Reference 1 and Japanese Unexamined Patent Application Publication No. 2008-159760 (Patent Reference 3) disclose a method for partial insulation coating of an electrode. In the case of a method in Japanese Unexamined Patent Application to Publication No. 2007-180473 (Patent Reference 5), a projection and an insulation coating are simultaneously formed.

SUMMARY OF THE INVENTION

In a storage element in which information is stored by inducing a change of state by applying voltage and causing current to flow between electrodes, the optimum electrode structure for reducing power consumption and suppressing element characteristic variation is a structure in which a projection is formed and the portion other than the projection is coated with an insulator. The projection position and the insulation coating position must be fitted together in a reproducible manner. For example, if the projection is insulation-coated, the advantageous effect of the projection would be lost. As such, when a case where the projection is coated in a certain element and the electrode is not coated in another element, the advantageous effect of the projections would vary and thus element characteristics would vary.

Patent References 1, 2, 4, and 6 disclose a method of forming a projection on an electrode. Furthermore, Patent Reference 1 and 3 disclose a method for partial insulation coating of an electrode. However, Patent References 1 to 4, and 6 fail to disclose a method of simultaneously performing the projection forming and partial insulation coating on the electrode. Performing the forming a projection on an electrode and the partial insulation coating of the electrode using separate processes is also possible in principle. However, in the case of such a method, productivity is low due to an increased number of processes. Furthermore, in a method of separately performing the projection forming and the partial insulation coating, satisfactorily-reproducible fitting is difficult due to the limitations in mating precision. In particular, as in Patent References 2 and 3, when projection forming or partial insulation coating is performed through a self-assembly process, performing the partial insulation coating or the projection forming while keeping positional relationships consistent is extremely difficult.

In the method in Patent Reference 5 both an electrode projection and a partial insulation coating are formed and the portion other than the electrode is insulated. However, the shape of the projection that is formed in this method is significantly different from the projections formed in the other Patent References, and is characterized by being a long, thin plate. In this method, the thickness (width) of the projection is the deposition thickness of the conductive material which is an electrically conductive material, and the length (amount of projection) of the projection is the height of an elevation change prior to the deposition of the conductive material minus the amount that is etched off using a Chemical Mechanical Polishing (CMP) process or the like.

In order to better obtain the advantageous effects of the projection such as the electric charge crowding effect, and so on, a smaller curvature radius of the projection is advantageous. In order to reduce the curvature radius with the method in Patent Reference 5, it is necessary to suppress the thickness of the electrode thin-plate which is the projection. Patent Reference 5 exemplifies a case where 20 nanometers is the thickness.

Next, the length of the projection shall be described. Since the CMP process used in Patent Reference 5 is a process requiring physical contact with the substrate of the pad in the fabrication, obtaining intra-plane uniformity and inter-wafer reproducibility is difficult. Normally, there is a variation in the tens of nanometers or more in the amount of etching. In view of this, in order to reliably form the projection across the entire region of all the wafers, the forming must be carried out with a higher elevation change in consideration of etching variation. As a result of when this method is used, the length (amount of projection) of the projection of the electrode necessarily becomes more than several tens of nanometers. In addition, the variation in the length of the projection is in the tens of nanometers. With such limitations, the projection that is formed using this method becomes longer than the projections formed using other methods, and variation becomes significant.

In the variable resistance memory, the electrical resistance change in a variable resistance layer or the interface of the variable its resistance layer and the electrode fulfills the role of information storage. Therefore, it is necessary to detect such resistance change in order to read information. Normally, resistance change is detected based on the amount of current flowing to the element or voltage drop that is measured by a circuit which uses a transistor, and the like. At is this time, the circuit can detect the resistance in the entire path from the variable resistance memory to the detection circuit. In other words, aside from the resistance of the variable resistance layer, it is possible to measure the resistance in the entire path from the variable resistance layer up to the measurement circuit such as a transistor. Therefore, no matter how large the resistance change at the part of the variable resistance layer is, if the resistance value at the fixed-resistance part in which the resistance throughout the entire path does not change is large, the resistance change percentage as a whole becomes small, and resistance change detection becomes difficult. Furthermore, if the resistance value of the fixed-resistance part varies in each element, it becomes difficult to distinguish between differences in resistance due to differences in memory information and variations in the resistance values of the fixed-resistance parts.

In the case of the thin-plate projection formed using the method in Patent Reference 5, the electrical resistance of the projection part is inversely proportional to the thickness of the thin-plate. Assuming that this thickness is several nanometers, the electrical resistance of this part cannot be disregarded. In particular, TiN, which is the conductive material disclosed in Patent Reference 5, has an electrical resistivity of approximately 10 to the −1 power to 0 power $\Omega$m (ohm meters), and thus has a resistance that is approximately 1000 times to 10,000 times higher than Pt or Al.

For example, in the case where the projection is formed using TiN with a width of 50 nanometers and a thickness of 5 nanometers, even assuming that the electrical resistivity of TiN is 1E−1 $\Omega$m, the TiN projection would be about 10 nm and would have an electrical resistance of 4 M$\Omega$.

Therefore, when attempting to sufficiently obtain the advantageous effect of a projection using the method in Patent Reference 5, the electrical resistance of the electrode-part increases. Specifically, with the method in Patent Reference 5, there is a trade-off relationship between the desirable effect brought about by the projection forming and the undesirable effect that electrical resistance increases, and it is not possible to increase the projection effect while suppressing the electrical resistance.

Furthermore, since the electrical resistance of the projection is proportional to the length of the projection, electrical resistance varies when this length varies. With the thin-plate projection made from TiN with a width of 50 nanometers and thickness of 5 nanometers, a 10 nm difference in length creates a 4 M$\Omega$ difference in resistance value. This variation in resistance value becomes an even more significant problem when the electrode width in each cell becomes narrower due to miniaturization.

However, with the method in Patent Reference 5, suppressing variations in the lengths of the projections is difficult. Therefore, with the method in Patent Reference 5, suppressing variations in electrical resistance is difficult.

As described above, with the methods described in the patent references, performing the projection forming and the partial insulation coating on the electrode at the same time while keeping the respective positional relationships consistent is difficult. Furthermore, it is difficult to suppress the variation in projection length while keeping consistent the positional relationships in the projection forming and partial insulation coating.

In view of the above-described problems, the present invention has as an object to provide a method of manufacturing a semiconductor memory device in which power consumption is reduced and variation in element characteristics is suppressed.

In order to solve the aforementioned problem, the method of manufacturing a semiconductor memory according to an aspect of the present invention includes: forming a stacked film above a substrate by stacking a reactive conductive material and a non-reactive conductive material; exposing a side surface of the stacked film; forming a projection by performing an insulator forming process on the exposed side surface of the stacked film to cause a predetermined length of a side surface of the reactive conductive material to change into an insulator such that a side surface of the non-reactive conductive material projects from the side surface of the reactive conductive material; forming a semiconductor layer covering the insulator and the projection; and forming a counter electrode covering the semiconductor layer, wherein the insulator forming process is an oxidation process or a nitridation process, the reactive conductive material is a material that undergoes a chemical reaction and changes into the insulator in the oxidation process or the nitridation process, and the non-reactive conductive material is a material that does not change into the insulator in the oxidation process or the nitridation process.

The inventors have done research on the problem of the structure and manufacturing process of a storage element in which information is stored by applying voltage and causing current to flow between electrodes to induce a change of state, and have arrived at the above-described method of manufacturing a semiconductor memory.

According to such a configuration, out of the stacked film, the reactive conductive material has a part thereof change into the insulator according to a chemical reaction and the side surface of the reactive conductive material recedes. Furthermore, the non-reactive conductive material, out of the stacked film, does not undergo a chemical reaction, and thus the position of the side surface of the non-reactive conductive material does not change. As a result, the side surface of the stacked film has a projection resulting from the non-reactive conductive material projecting further than the reactive conductive material, and the portion other than the projection is coated by an insulation coating. Here, the side surface of the stacked film refers to the surface that is parallel to the stacking direction of the reactive conductive material and the non-reactive conductive material.

Therefore, projection forming and partial insulation coating on the side surface of the stacked film which serves as an electrode can be performed at the same time while keeping positional relationships consistent. With this configuration, current flows in a concentrated manner from the projection portion to the counter electrode, and thus memory writing can be performed efficiently using a small amount of current, and the power consumption of the semiconductor memory can be reduced.

Furthermore, since the shape of the projection of the electrode can be formed evenly, it is possible to suppress variation in the electrical resistance of the electrode and suppress variation in the element characteristics of memory cells.

Furthermore, since projection forming and partial insulation coating on the electrode can be performed at the same time, the manufacturing processes for the semiconductor memory can be reduced.

Furthermore, it is preferable that the method further includes, prior to the forming of a stacked film: forming an insulating layer on the substrate; and forming an etching-stop layer on the insulating layer, wherein, in the forming of a stacked film, the stacked film is formed above the etching-stop layer, in the exposing of a side surface of the stacked film, the side surface of the stacked film is exposed by forming a hole from a top surface of the stacked film up to the etching-stop layer.

According to this configuration, in a semiconductor memory in which plural memory cells are formed in a skewered state, a projection and an insulation coating can be formed at the same time in the side surface of the stacked film which is exposed from the side wall of the hole formed in the stacked film.

Furthermore, it is preferable that the method further includes, prior to the forming of a stacked film: forming a wire layer on the substrate; forming an insulating layer on the wire layer; and forming a hole from a top surface of the insulating layer up to the wire layer, wherein, in the forming of a stacked film, the stacked film is formed on a portion of the wire layer which corresponds to a bottom plane of the hole, a portion of the insulating layer which corresponds to a side wall of the hole, and the top surface of the insulating layer, and in the exposing of the side surface of the stacked film, part of the stacked film is removed by etching so as to expose the side surface of the stacked film formed on the portion of the insulating layer corresponding to the side wall of the hole.

According to this configuration, in a semiconductor memory in which plural memory cells are formed in a plane, a projection and an insulation coating can be formed at the same time in the exposed side surface of the stacked film.

Furthermore, it is preferable that the stacked film has a trilayer structure in which one of the reactive conductive material and the non-reactive conductive material is formed on both upper and lower surfaces of the other of the reactive conductive material and the non-reactive conductive material.

According to this configuration, at least one projection can be formed in the exposed side surface of the stacked film.

Furthermore, it is preferable that the semiconductor layer is a variable resistance film.

According to this configuration, in a ReRAM, a projection and an insulation coating can be formed at the same time on the side surface of the counter electrode that is in contact with the variable resistance film.

Furthermore, it is preferable that the semiconductor layer is a tunnel insulating film, and the counter electrode is a ferromagnet.

According to this configuration, in an MRAM, a projection and an insulation coating can be formed at the same time on the side surface of the ferromagnet which is a counter electrode that is in contact with the variable resistance film.

For example, it is preferable that the reactive conductive material is at least one metal from among aluminum, copper, and magnesium, or an alloy including at least one of aluminum, copper, and magnesium, or at least one of single-crystalline silicon or polycrystalline silicon that is doped with the alloy.

According to this configuration, an insulator can easily be formed on the side surface of the reactive conductive material while keeping positional relationships consistent.

Furthermore, it is preferable that the non-reactive conductive material is at least one of platinum, gold, and silver.

According to this configuration, the non-reactive conductive material does not change even when the insulator forming process is performed, and thus a projection can easily be formed on the side surface of the reactive conductive material while keeping positional relationships matched.

Furthermore, it is preferable that the insulator forming process is an oxidation process, and the non-reactive conductive material is at least one of ruthenium, zinc, tin, titanium, ruthenium oxide, zinc oxide, tin oxide, titanium oxide, and indium-tin-oxide.

According to this configuration, the non-reactive conductive material does not oxidize even when an oxidation process is performed as the insulator forming process, and thus a projection can easily be formed on the side surface of the reactive conductive material while keeping positional relationships consistent.

Furthermore, it is preferable that the insulator forming process is oxygen plasma treatment or heat treatment in a chemical substance atmosphere including an oxygen element.

Furthermore, it is preferable that the insulator forming process is contact processing using a liquid oxidizing agent or nitrogen plasma treatment.

According to such a configuration, a projection and an insulation coating can easily be formed at the same time on the side surface of the stacked film.

According to the present invention, it is possible to provide a method of manufacturing a semiconductor memory device in which power consumption is reduced and variation in element characteristics is suppressed.

FURTHER INFORMATION ABOUT TECHNICAL BACKGROUND TO THIS APPLICATION

The disclosure of Japanese Patent Application No. 2009-180296 filed on Aug. 3, 2009, including specification, drawings and claims is incorporated herein by reference in its entirety.

The disclosure of PCT Application No. PCT/JP2010/004708 filed on Jul. 23, 2010, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIGS. 8A and 8B are diagrams showing the manufacturing process of the memory cell according to Embodiment 1;

DESCRIPTION OF THE PREFERRED EMBODIMENTS

Hereinafter, embodiments of the present invention shall be described with reference to the Drawings. It should be noted that although the present invention shall be described with reference to the following embodiments and the Drawings, these embodiments and Drawings are merely for exemplification and are not intended to limit the present invention to such embodiments and Drawings.

Embodiment 1

In Embodiment 1, a method of manufacturing a ReRAM in which a variable resistance film is provided in a side surface of an electrode shall be described using FIGS. 1 to 9. It should be noted that these diagrams are intended for showing the positional relationship of respective components and thus thickness and length proportions are not uniform. Furthermore, although plural memory cells are normally formed within the substrate surface, FIGS. 3 to 9 show a cross-sectional view of a vicinity of one cell among these memory cells.

Figure 1:
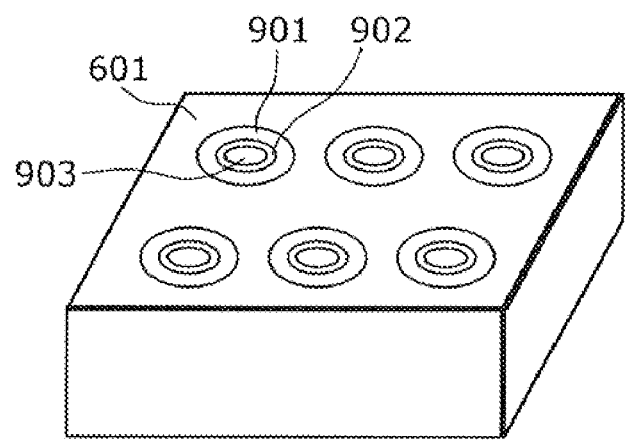
FIG. 1 is an outline configuration diagram of a memory cell of an ReRAM according to Embodiment 1.

FIG. 1 is an outline configuration diagram of a memory cell of a ReRAM. A semiconductor memory such as the ReRAM requires circuits for driving respective memory cells. These can make use of semiconductor integrated circuits manufactured using the usual CMOS process and so on. Although a memory cell and a drive circuit can be connected by wiring after being manufactured in separate substrates, integrating the memory cell and the drive circuit on the same substrate is advantageous in terms of operating speed and manufacturing efficiency. In view of this, here, as shown in FIG. 1, the case of manufacturing memory cells on the same substrate shall be exemplified. A memory cell and a drive circuit can also be disposed by being aligned on the same substrate, and it is also possible to stack the memory cell on the drive circuit. Here, description shall be carried out exemplifying the latter. It should be noted that the present embodiment is possible regardless of the relative positions of the memory cell and the drive circuit.

The memory cell of the ReRAM is formed on a substrate 500 that includes a drive circuit (not illustrated), and includes, in a predetermined position of an interlayer insulating layer 601, a variable resistance film 901 which is a semiconductor layer, and Pt 902 and W 903 which are counter electrodes as shown in FIG. 1. Furthermore, a stacked film 506 (refer to FIG. 8B), which serves as an electrode, is formed below the interlayer insulating layer 601, and the variable resistance film 901 is sandwiched between the stacked film 506 and the Pt 902. Furthermore, plural stacked films 506 are formed in the perpendicular direction with respect to the substrate 500, and thus forming skewered memory cells which share the Pt 902 which is a counter electrode.

Figure 2:
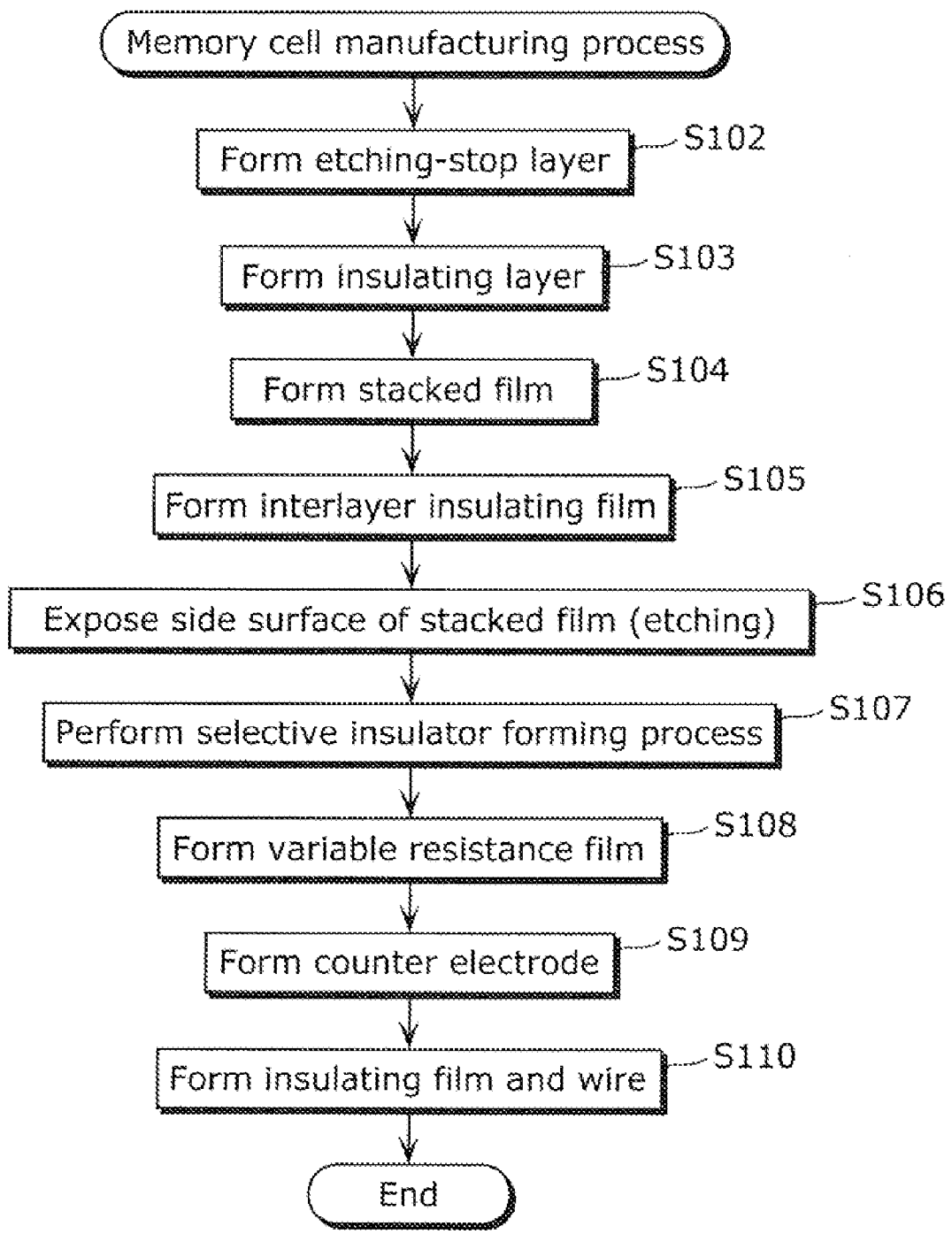
FIG. 2 is a flowchart for describing the manufacturing process of the memory cell according to Embodiment 1.

FIG. 2 is a flowchart for describing a manufacturing process of the memory cell of the ReRAM, and FIGS. 3 to 9 are diagrams showing the manufacturing process of the memory cell.

When stacking the memory cell on the drive circuit, it is preferable that an insulating layer 501 (refer to FIG. 3A) be formed on an upper layer of the substrate 500 in which the drive circuit is formed. For the insulating layer 501, it is possible to use an insulating film that is used as an interlayer insulating film of a multilayer wire in the typical CMOS process. Specifically, the insulating layer 501 may be formed using a silicon oxide film formed from Tetraethoxysilane (TEOS) and so on, or Boro-phospho silicate glass (BPSG), porous silica, and so on. As a method of forming these films, it is sufficient to use the interlayer insulating film forming method in the typical CMOS process. For example, for TEOS or BPSG, the chemical vapor deposition method (CVD method) can be used. Porous silica can be formed using the sol-gel method, and so on.

Due to the projections of a gate and a wire included in the drive circuit, there are cases where unevenness is created in the insulating layer 501 on the substrate 500. Since excessive unevenness hinders the forming of the memory cell, it is preferable that the insulating layer 501 be planarized using a chemical mechanical polishing (CMP) process, and the like, prior to the ReRAM forming process described below.

The present embodiment describes the process portion of forming the cell of the ReRAM on the insulating layer 501, starting from the point where the drive circuit is already formed, the insulating layer 501 is deposited, and planarization is finished.

Figure 3A:
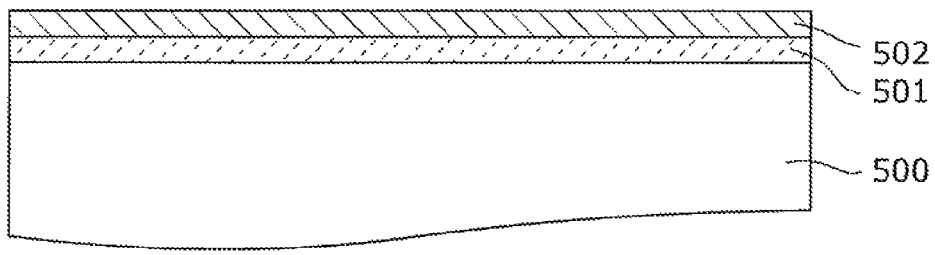
FIGS. 3A to 3C are diagrams showing the manufacturing process of the memory cell according to Embodiment 1.

First, as shown in FIG. 3A, an etching-stop layer 502 is formed on the insulating layer 501 on the substrate 500 in which the drive circuit is formed (step S102). This is a layer for stopping the etching in the etching process for exposing the side surface of the stacked film 506 to be described later, between the substrate 500 in which the drive circuit is formed and the stacked film 506 so that the etching does not reach up to the substrate 500 and destroy the drive circuit present therein. This becomes necessary due to the stacking of the drive circuit and the memory cell, and is not required when stacking is not performed. In such case, the process may start from the forming of the subsequent insulating layer 503.

In order to stop the etching at the etching-stop layer 502, there are two methods, namely, the active method and the passive method.

The active method is a method of detecting that the etching has reached the etching-stop layer 502, and stopping the etching. In the case of this method, the etching-stop layer 502 is required to have a function that makes it possible to detect that the etching has reached the etching-stop layer 502. This can be implemented by forming the etching-stop layer 502 from a material that includes an element that is essentially not included in the stacked film 506 that is to be etched.

When the etching reaches the etching-stop layer 502, such element appears in the atmosphere. By detecting this using plasma emission spectroscopy or a quadrupole mass spectrometer, the etching can be stopped at the etching-stop layer 502 based on such information. Most of the dry etching devices used in semiconductor factories are equipped with such a specific-element detecting device, or what is called an endpoint monitor, and are thus provided with a function for automatically stopping etching based on a signal thereof.

For example, as the etching-stop layer 502, it is possible to use a silicon nitride film when nitrogen is not included in the stacked film 506, or polycrystalline silicon doped with phosphorous when phosphorous is not included, or polycrystalline silicon doped with boron when boron is not included. Obviously, other materials may be used as the etching-stop layer.

In the case of the passive method, a layer having sufficient thickness is used as the etching-stop layer 502 so that etching does not reach the semiconductor integrated circuit layer even when the time required for etching the stacked film 506 varies within the surface of the substrate 500 or among respective substrates, and even when the process is performed for the maximum time. This sufficient thickness can be calculated in the manner described below. Specifically, assume that in the etching of the stacked film, the fastest time in which etching is completed is denoted as t1, and the slowest time in which etching is completed is denoted as t2. The etching-stop layer is exposed to etching for a maximum length of t2−t1. Assuming that the amount of the etching-stop layer 502 that is etched per unit time is A, the objective can be achieved by stopping the etching at the time t2 as long as the thickness of the etching-stop layer 502 is not less than A×(t2−t1).

With this method, the material of the etching-stop layer 502 may be selected to overlap with the material of the stacked film 506. In other words, even when a silicon oxide film is included in the stacked film 506, a silicon oxide film may be used for the etching-stop layer 502. Obviously, a material that is not included in the stacked film 506 may be selected. It should be noted that in this method, the required thickness decreases as the amount A that is etched per unit time decreases. Therefore, the thickness can be minimized by using a material that is hard to etch, such as alumina or a silicon nitride film. It should be noted that since the above-described A and t1 and t2 are dependent on the material and thickness of the stacked film 506, etching conditions, etching device uniformity, reproducibility, and so on, it is preferable that these values be calculated before hand by experimentation, simulation, and so on.

It should be noted that in the present embodiment, description shall be carried out exemplifying the case where a silicon nitride film is used as the etching-stop layer 502 and etching is stopped according to the active method.

The silicon nitride film can be deposited using the chemical vapor deposition method (CVD method) and the like.

Figure 3B:
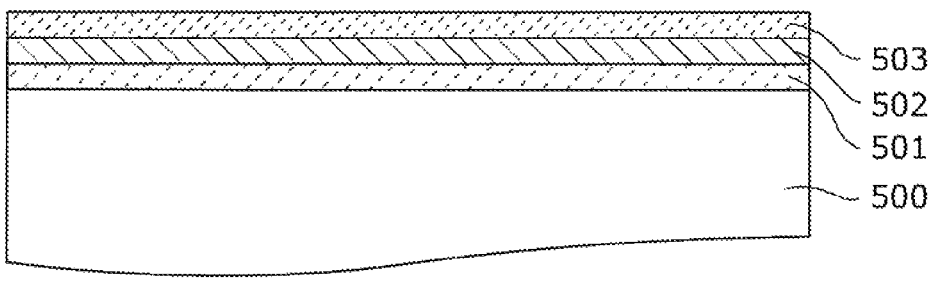

Next, as shown in FIG. 3B, the insulating layer 503 is deposited on the etching-stop layer 502 (step S103). The insulating layer 503 may be of the same material as an interlayer insulating film used in the usual semiconductor integrated circuit. For example, Tetraethoxysilane (TEOS), Boro-phospho silicate glass (BPSG), porous silica, and so on, can be used. The same process as in the interlayer insulating film used in the usual semiconductor integrated circuit is sufficient as the method of depositing the insulating layer 503 on the etching-stop layer 502. For example, deposition processes such as the plasma CVD method, the sputtering method, and the LPCVD method can be used.

It should be noted that the insulating film 503 may be omitted when the underlying layer (that is, the etching-stop layer 502 when the etching-stop layer 502 is provided, or the upper most layer of the substrate 500 in which the memory cell forming process is to be performed, when the etching-stop layer 502 is not provided) has good insulation properties.

Figure 3C:
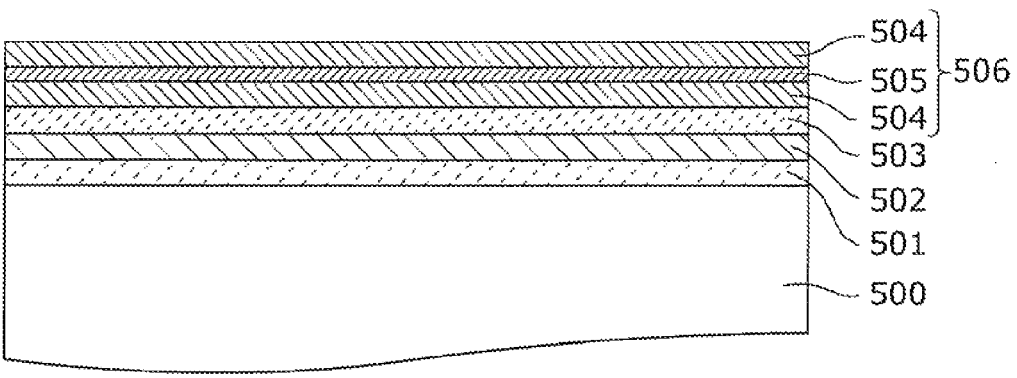

Next, as shown in FIG. 3C, the stacked film 506, which includes at least two types of conductive material, is stacked on the insulating layer 503 (step S104). The stacked film 506 has a layered configuration including a reactive conductive material 504 and a non-reactive conductive material 505, and serves as an electrode that is in contact with the variable resistance film 901 in the memory cell. The reactive conductive material 504 is a material that undergoes a chemical reaction and changes into an insulator in an oxidation process or nitridation process. The non-reactive conductive material 505 is a material that does not undergo a chemical reaction and does not change into an insulator in the oxidation process or nitridation process.

At least one reactive conductive material 504 is selected from materials which undergo a chemical reaction to change into an insulator 801 in a "selective insulator forming process" of forming an insulator 801 to be described later. Furthermore, at least one non-reactive conductive material 505 is selected from materials which do not undergo the chemical reaction to change into an insulator in the selective insulator forming process of forming the insulator 801. It should be noted that the reactive conductive material 504 and the non-reactive conductive material 505 to be stacked need not be of one type each, and may include, for example, three types of conductive materials with the reactive conductive material 504 being made of two types and the non-reactive conductive material 505 being made of one type.

The above-described reactive conductive material 504 is required to have three characteristics. The first is that (1) part of the reactive conductive material 504 undergoes the chemical reaction to change into the insulator 801 in the selective insulator forming process. The second is that, (2) due to such chemical reaction, part of the reactive conductive material 504 changes into the insulator 801, and the volume of the reactive conductive material 504 decreases (hereafter denoted as being "consumed"). The third is that (3) the part of the reactive conductive material 504 that does not undergo a chemical reaction is electrically conductive.

Here, description shall be carried exemplifying aluminum (Al) as the reactive conductive material 504 which forms the insulator 801 and platinum (Pt) as the non-reactive conductive material 505 which does not form the insulator 801.

Aluminum is a metal that is highly prone to oxidation. When aluminum is placed in an oxidizing atmosphere such as oxygen plasma, an oxidation reaction easily occurs and the surface of aluminum changes to an aluminum oxide such as $Al_2O_3$.

Aluminum oxide has excellent insulation properties. The oxidation reaction of aluminum has the characteristic of forming a strong and smooth aluminum oxide on the surface while consuming the aluminum, but maintaining the aluminum as is in a layer lower than the formed aluminum oxide. This non-oxidized aluminum has excellent conductivity.

On the other hand, Pt is extremely resistant to oxidation as opposed to aluminum. When Pt is placed under an oxygen plasma atmosphere, Pt does not undergo an oxidation reaction and continues to maintain conductivity.

Therefore, when oxygen plasma treatment is assumed for the selective insulator forming process, aluminum and Pt satisfy the above described conditions for the reactive conductive material 504 and the non-reactive conductive material 505, respectively.

It should be noted that the present embodiment is not limited to the combination of performing an oxidation process using oxygen plasma on the aluminum which is the reactive conductive material 504 and Pt which is the non-reactive conductive material 505, and combinations of other materials and processes are also possible. Processes and materials that satisfy the conditions of the present embodiment can be found, for example, through the procedure below.

First, it is necessary to find a conductive material whose chemical compound changes into an insulator. A process that causes a chemical reaction that changes a conductive material into an insulating chemical compound becomes a candidate for the selective insulator forming process. So, next, a specific process that causes such chemical reaction is found. Finally, the non-reactive conductive material 505 that does not change into an insulator in the candidate chemical reaction process is found. When such a material is found, the reactive conductive material, the process that causes a chemical reaction, and the non-reactive conductive material that have been named as candidates are respectively adopted as the reactive conductive material, the process that causes a chemical reaction, and the non-reactive conductive material in the present embodiment.

A specific example is given below.

First, an example is given for the reactive conductive material 504 which is a conductive material whose chemical compound changes into an insulator. For example, in addition to aluminum mentioned in the present embodiment, a metal such as copper and magnesium, an alloy including those metals, such as Al—Si—Cu, or single-crystalline or polycrystalline silicon doped with such alloys, are conductors, and oxides or nitrides thereof are insulators. Therefore, these materials become candidates for the reactive conductive material 504 in the present embodiment.

Next, an example of the selective insulator forming process shall be given. For oxidation, aside from the oxygen plasma treatment given in the present embodiment, it is also possible to cause oxidation through (i) heat treatment in a chemical substance atmosphere including an oxygen element such as oxygen, ozone, and the like, and (ii) contact with a liquid oxidizing agent such as sodium hypochlorite, hydrogen peroxide, and potassium dichromate, and so on. Nitridation can be brought about by nitride plasma processing, thermal treatment under a nitrogen atmosphere, and so on. These processes become candidates for the selective insulator forming process.

Finally, an example of the non-reactive conductive material 505 that does not change into an insulator in the chemical reaction process shall be given. Such a non-reactive conductive material 505 is broadly classified into three types, namely, (1) one that does not undergo a chemical reaction in a chemical reaction processes named as a candidate, (2) one in which the product in the chemical reaction processes named as a candidate is conductive, and (3) a conductive product among products in chemical reaction processes named as a candidates.

The non-reactive conductive material 505 in (1) does not undergo a chemical reaction in a chemical reaction process named as a candidate due to poor chemical reactivity, and thus does not form the insulator 801. Pt described above in the present embodiment is a representative thereof. Aside from Pt, gold or silver, for example, does not undergo a chemical reaction in most oxidation processes and nitridation processes, and thus can be used in the present embodiment whether in an oxidation process or a nitridation process.

The non-reactive conductive material 505 in (2) utilizes the fact that, even when a chemical reaction occurs, an insulator 801 is not formed when the product in the chemical reaction is conductive. A combination of ruthenium, zinc, tin, titanium, and so on, and an arbitrary oxidation process can be given as a combination of such a material and chemical reaction. This is because, the oxides thereof are conductive.

The non-reactive conductive material 505 in (3) utilizes the fact that, in products in certain chemical reactions, a change in conductivity is not brought about by such chemical reaction. For example, even when a conductive material such as ruthenium oxide, zinc oxide, tin oxide, and indium-tin-oxide (ITO), is exposed to an oxidation process, no further chemical change occurs. Therefore, the insulator is not formed. In this manner, when the non-reactive conductive material 505 is an oxide, an arbitrary oxidation process can be used in the selective insulator forming process.

In the stacking of the reactive conductive material 504 and the non-reactive conductive material 505, the thickness of the non-reactive conductive material 505 which does not form the insulator 801 becomes the width of the electrode projection that comes into contact with the variable resistance film 901 in the memory cell, and the total thickness of the stacked film 506 (the reactive conductive material 504 and the non-reactive conductive material 505) becomes the width of the electrode. In view of this, the thicknesses of the reactive conductive material 504 and the non-reactive conductive material 505 are determined in consideration of the width of the projection to be formed and the width of the electrode of the memory cell.

In order to effectively cause electric field crowding and precisely determine current position, it is preferable that the thickness of the reactive conductive material 504 which does not form the insulator 801 be kept to 100 nanometers or less, and more preferably to a few nanometers. Furthermore, in order not to make the electrical resistance of the entire cell too large, it is preferable that the thickness of the stacked film 506 (the reactive conductive material 504 and the non-reactive conductive material 505) be in the tens of nanometers or greater, and more preferable 100 nanometers or greater.

It should be noted that in each of the stacked films 506, the reactive conductive material 504 and the non-reactive conductive material 505 need not be one layer each, and may each be multiple layers. Furthermore, the reactive conducive material 504 and the non-reactive conducive material 505 to be stacked need not be of one type each, and, for example, three or more types of conductive materials, in which the reactive conductive material 504 is made of two types of conductive material and the non-reactive conductive material 505 is made of one type of conductive material, may be stacked. In this case, it is sufficient to include at least one type of the material which undergoes the chemical reaction to form the insulator 801 in the selective insulator forming process, and at least one type of the material that does not undergo the chemical reaction to form the insulator 801. Furthermore, the material belonging to one or both of the reactive conductive material 504 and the non-reactive conductive material 505 may include a plurality of materials.

Exemplified here is the case of stacking 50 nanometers of aluminum as the reactive conductive material 504, 5 nanometers of a Pt layer as the non-reactive conductive material 505, and further on top of that, 50 nanometers of aluminum as reactive conductive material 504.

The stacking of the reactive conductive materials 504 and the non-reactive conductive material 505 can be performed by sequentially performing the deposition of the respective reactive conductive materials 504 and non-reactive conductive material 505, using a deposition process such as sputtering, vapor deposition, plating, CVD process, and so on. The deposition process for the films in the stacked film 506 (the reactive conductive materials 504 and the non-reactive conductive material 505) is widely used in the forming of the electrode of a semiconductor element, and so on, and forming evenly and reproducibly in thicknesses of nanometer precision is also possible using the conventional techniques.

Figure 4A:
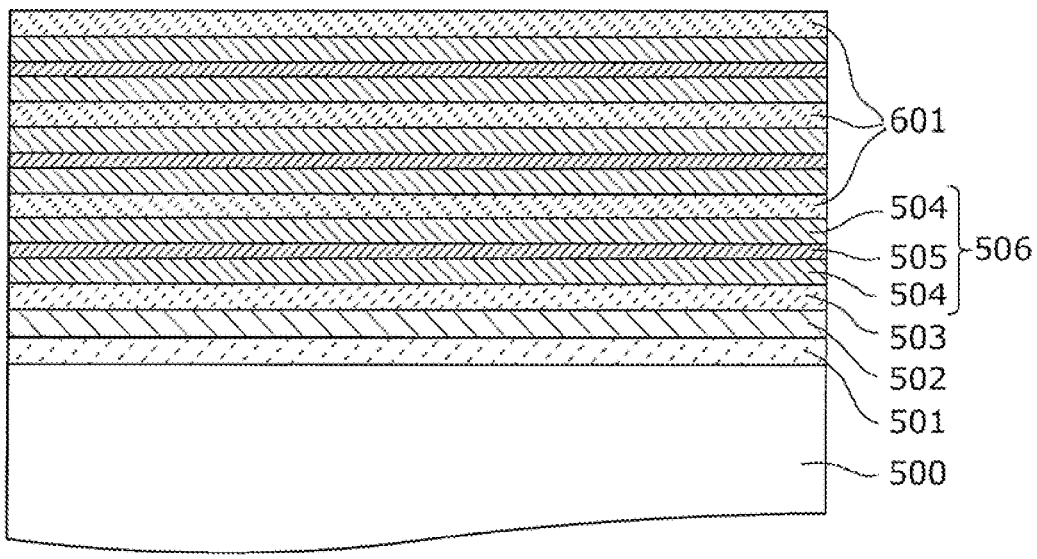
FIGS. 4A and 4B are diagrams showing the manufacturing process of the memory cell according to Embodiment 1.

Next, as shown in FIG. 4A, the interlayer insulating layer 601 is deposited on the stacked film 506 (the reactive conductive materials 504 and the non-reactive conductive material 505) (step S105). The interlayer insulating layer 601 is a layer that is disposed to insulate between the plural stacked films 506 that are stacked. The same material as that used as an interlayer insulating layer for the conventional semiconductor multilayer wiring can be used as the material of the interlayer insulating layer 601. For example, an oxide film made of TEOS, or BPSG, porous silica, and so on, can be used. Furthermore, the forming process for the interlayer insulating layer for semiconductor multilayer wiring can be used as the deposition process of the interlayer insulating layer 601.

Exemplified here is the case of depositing approximately 100 nanometers of the interlayer insulating layer 601 generated from TEOS by CVD. The deposition of the stacked film 506 (the reactive conductive materials 504 and the non-reactive conductive material 505) and the interlayer insulating layer 601 is repeated as many times as the number of the cells to be stacked. Specifically, the stacked film 506 that is sandwiched by two of the interlayer insulating layers 601 becomes an electrode in one memory cell. Therefore, the semiconductor memory shown in FIG. 4A shows a manufacturing method in which three cells are formed in the perpendicular direction with respect to the substrate 500. It should be noted that this repetition is not absolutely necessary, and there may be one layer each of the stacked film 506 and the interlayer insulating layer 601.

Figure 4B:
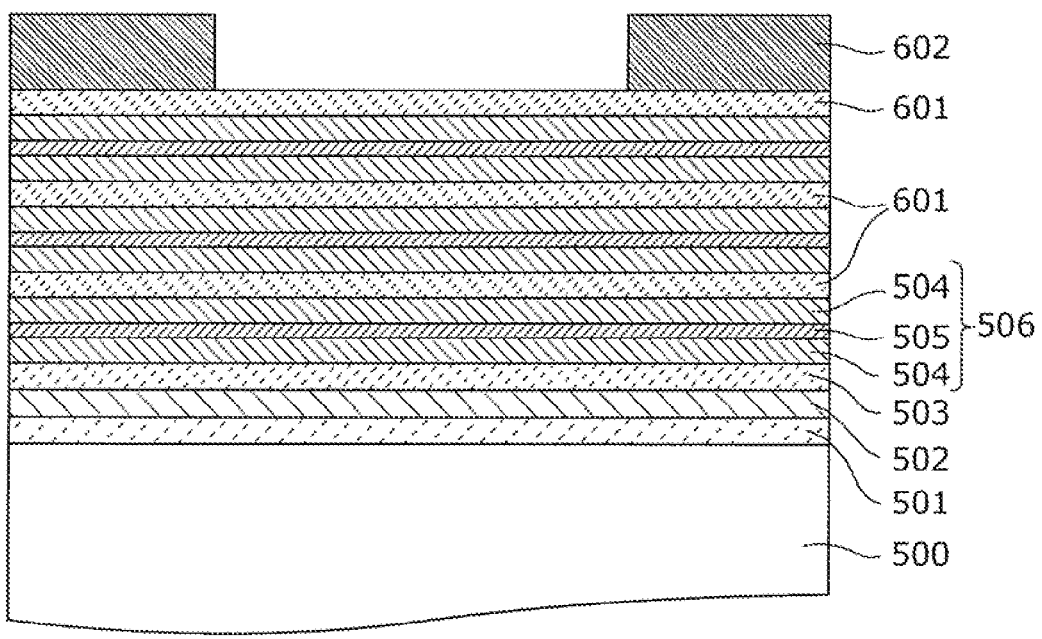
Figure 5A:
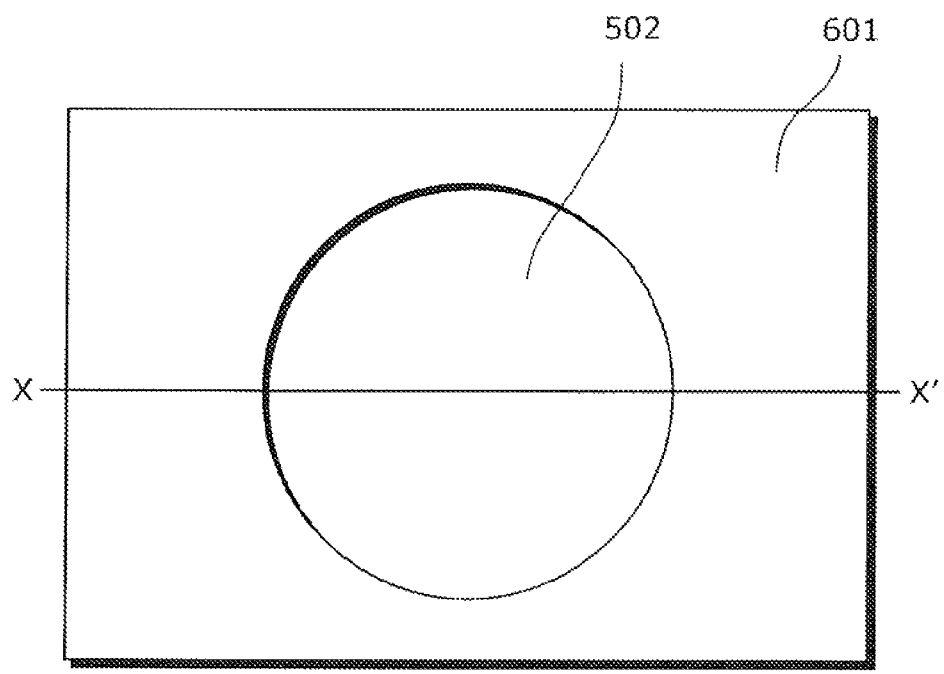
FIGS. 5A and 5B are diagrams showing the manufacturing process of the memory cell according to Embodiment 1.
Figure 5B:
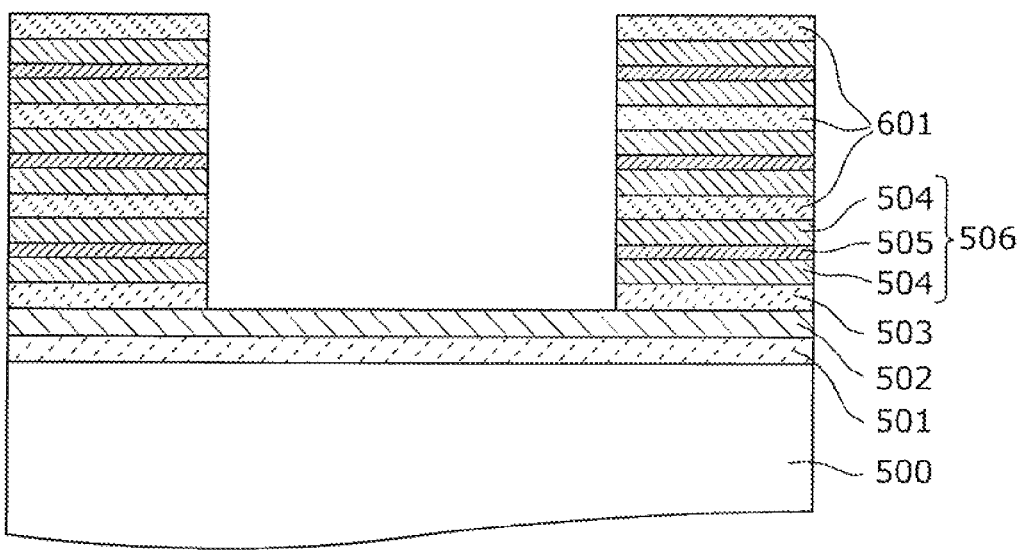

Next, a hole is formed in the stacked film 506 (the reactive conductive materials 504 and the non-reactive conductive material 505) (step S105) by etching, and the side surface of the stacked film 506, that is, the side parallel to the stacking direction of the reactive conductive materials 504 and the non-reactive conductive material 505, is exposed (step S106). As shown in FIG. 4B, photolithography or electron beam lithography is performed such that a resist mask 602 remains only in the portions on which etching is not performed. Subsequently, as shown in FIG. 5A and FIG. 5B, dry etching or wet etching is performed so as to penetrate through the insulating layer 503, the respective interlayer insulating layers 601, and the respective reactive conductive materials 504 and non-reactive conductive material 505, to expose the side surface of the stacked film 506. It should be noted that FIG. 5A is a diagram of the cell after etching, as seen from the top surface of the substrate, and FIG. 5B is a cross-sectional view along the line X-X' in FIG. 5A.

In the present embodiment, the case of forming a hole by dry etching to expose the side surface of the stacked film 506 in the side wall inside the hole is exemplified. However, the side surface exposing method does not need to be implemented through the forming of a hole, and may be a method of forming a trench in the stacked film 506 so as to expose the side surface of the stacked film as the side walls of the trench, and may be a method of performing etching to leave behind the stacked film 506 in a column-shape such that the side surface of the stacked film 506 is exposed on the outer side thereof.

It should be noted that since the present embodiment covers the case of performing the etching-stop actively, plasma emission spectroscopy measurement is performed during the dry etching, and etching is stopped at the point when nitrogen is detected. Obviously, passive etching-stop may also be performed.

Figure 6A:
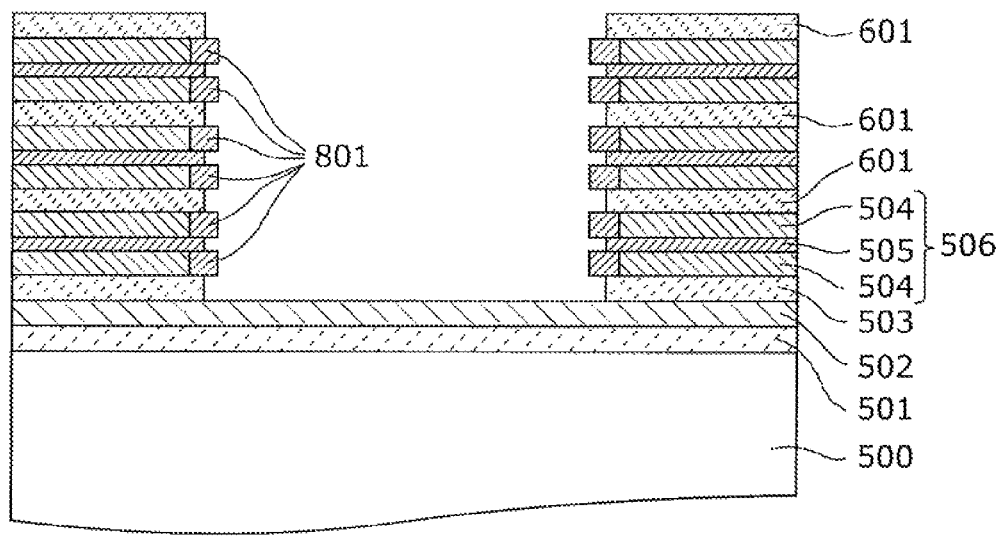
FIGS. 6A and 6B are diagrams showing the manufacturing process of the memory cell according to Embodiment 1.
Figure 6B:
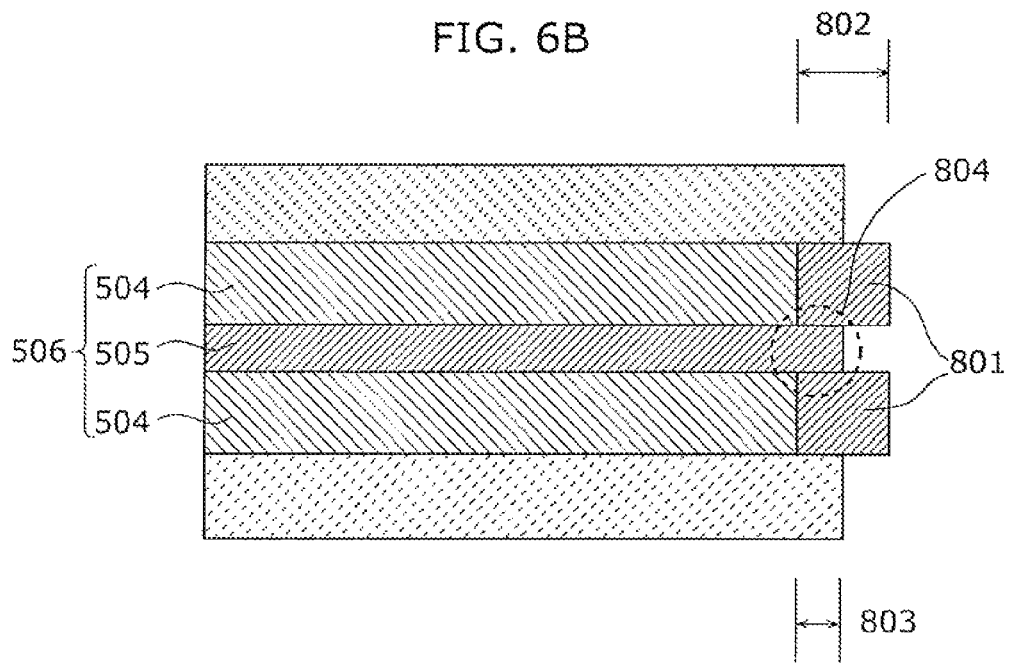

Next, the selective insulator forming process shown in FIG. 6A and FIG. 6B is performed (step S107). FIG. 6A is a cross-sectional view of a memory cell after insulators 801 are formed through the selective insulator forming process, and FIG. 6B an enlarged view of the vicinity of a side surface of one electrode.

As described earlier, the "selective insulator forming process" is a process in which, out of the reactive conductive materials 504 and the non-reactive conductive material 505 whose side surfaces are exposed, the reactive conductive materials 504 form the insulators 801 on its side surfaces through chemical reaction, and the non-reactive conductive material 505 does not undergo the chemical reaction to form the insulators. Specifically, the selective insulator forming process is a process in which the insulators 801 are selectively formed on the side surfaces of the reactive conductive materials 504.

It should be noted that, aside from selectivity, the process of oxidation process or nitridation process is selected to meet the conditions that it is a process in which the chemical reaction that forms the insulator 801 consumes the reactive conductive material 504 which undergoes the chemical reaction, that is, reduces the volume of the reactive conductive material 504, and that the part of the reactive conductive material 504 that did not undergo the chemical reaction is conductive.

In the present embodiment, the case of using the oxygen plasma treatment as a process satisfying these conditions shall be described. Plasma treatment is widely used in the conventional semiconductor processes, for dry etching, resist removal, and so on. In particular, plasma treatment is a standard method in resist removal.

By exposing aluminum to oxygen plasma, an aluminum oxide generating reaction occurs on the surface of the aluminum. Aluminum oxide is an insulator having excellent insulation properties. On the other hand, Pt is a metal that is extremely resistant to oxidation, and thus even when Pt is placed under an oxidizing atmosphere such as oxygen plasma, and the like, Pt does not oxidize. Therefore, insulator forming does not occur on the surface of Pt. Therefore, oxygen plasma treatment satisfies the condition of selectivity.

Furthermore, since aluminum is consumed in the process of generating aluminum oxide, the second condition is also satisfied. In addition, since the aluminum oxide generating reaction advances from the surface, and the inner part in which a reaction does not occur is still the conductive metal aluminum, the third condition is satisfied. Therefore, oxygen plasma treatment satisfies all the conditions of a selective insulator forming process.

The process of generating aluminum oxide from aluminum using oxygen plasma is described in detail in the Non-Patent Reference (Thin Solid Films vol. 516, page 1871; 2008 publication; Fu-Hsing Ju, et al.), and so on. As described in this Non-Patent Reference, the oxygen plasma treatment for aluminum oxide can be carried out using the same apparatus as the conventional dry etching apparatus, and using only oxygen as the source gas. Specifically, such oxygen plasma treatment can be carried out by holding a substrate in an atmosphere-controllable vacuum container, heating the substrate, introducing the plasma source gas (oxygen here) into the container, converting the source gas into plasma by radio-frequency heating and so on, and exposing the substrate to the plasma. Furthermore, an Electron Cyclotron Resonance (ECR) plasma treatment configuration in which plasma is formed in a state where a magnetic field is applied may be carried out.

When the selective insulator forming process is performed, the insulator 801 of a thickness corresponding to the oxygen plasma treatment time is formed on the side surface of the reactive conductive materials 504. Since the reactive conductive material 504 is consumed through the chemical reaction for forming this insulator 801, the position of the side surface of the reactive conductive material 504 recedes from the original side surface position, in accordance with the treatment time.

As shown in FIG. 6B, there is a chemical reaction-defined proportional relationship between thickness 802 of the insulator 801 and a recession amount 803 of the side surface of the reactive conductive material 504. Using the oxidation process of aluminum as an example, for each unit volume of aluminum (reactive conductive material 504) consumed, 1.3 times as much of aluminum oxide (insulator 801) is generated. Inversely, the position of the side surface of the aluminum recedes by as much as approximately 0.8 times the amount of aluminum oxide generated. In other words, in the case of the oxidation process of aluminum, the recession amount 803 of the side surface of the reactive conductive material 504 is 0.2 times the thickness 802 of the insulator 801. It should be noted that such proportionality coefficient is different for each type of chemical reaction.

Figure 7:
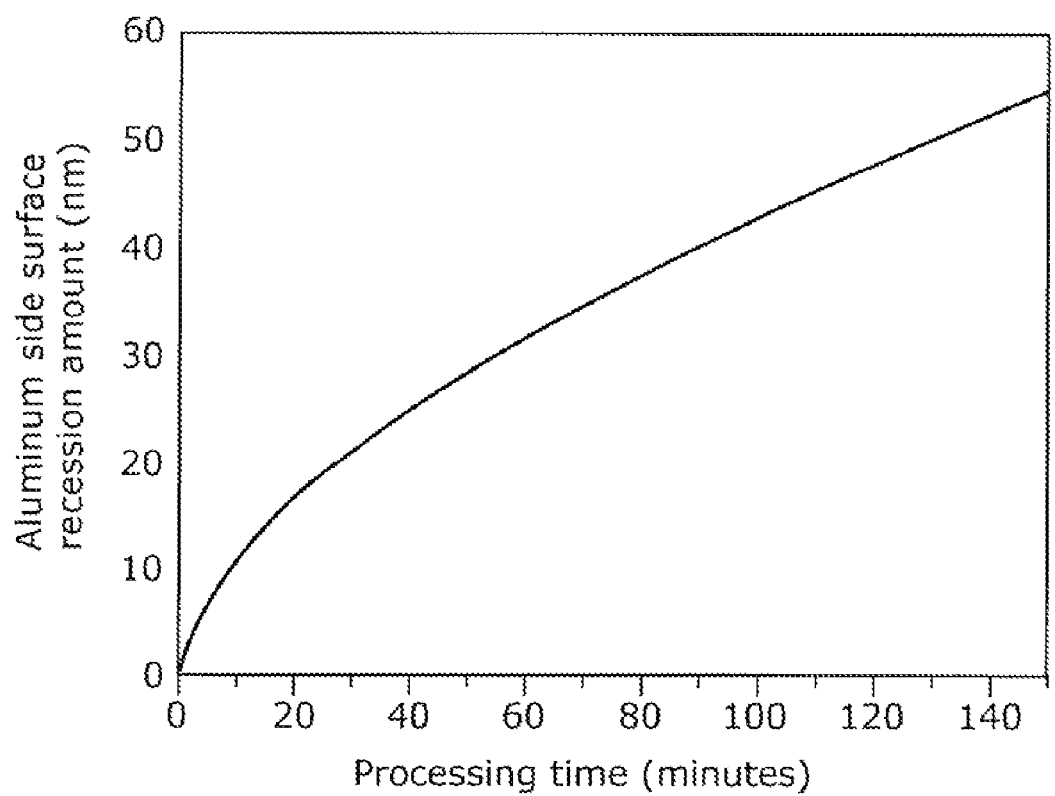
FIG. 7 is a graph showing a relationship between oxygen plasma treatment time and a recession amount of the side surface of aluminum.

FIG. 7 is a graph showing the relationship between the oxygen plasma treatment time and the recession amount of the side surface of aluminum. FIG. 7 shows the relationship between a treatment time for oxygen plasma exposure at a substrate temperature of 550° C., a frequency of 13.56 MHz, and intensity of 400 W, and the recession amount of the aluminum end surface. In this manner, through the oxygen plasma treatment, the aluminum end surface recedes by an amount that is in accordance to the processing time.

According to the above-described process, the forming of the insulator 801 is performed on the exposed side surface of the reactive conductive material 504. When a plurality of the reactive conductive materials 504 are formed, the forming of the insulator 801 is performed on the respective side surfaces of all the reactive conductive materials 504. Therefore, at the point in time when the selective insulator forming process is completed, the side surfaces of all the reactive conductive materials 504 are coated by insulators 801.

The chemical reaction for forming the insulator 801 starts from the exposed side surface of the reactive conductive material 504, with the reaction progressing with time. Since the reactive conductive material 504 is consumed in the chemical reaction, the side surface of the reactive conductive material 504 recedes along with the progress of the chemical reaction.

On the other hand, since the chemical reaction for generating the insulator in the selective insulator forming process does not occur with the non-reactive conductive material 505, the side surface of the non-reactive conductive material 505 remains at the position prior to the process.

In this manner, since the side surface of the reactive conductive materials 504 which undergo the chemical reaction recedes whereas the side surface of the non-reactive conductive material 505 which does not undergo the chemical reaction does not recede when the selective insulator forming process is performed, the side surface of the non-reactive conductive material 505 projects outward, thereby forming a projection 804.

In other words, in this process, the projection 804 is formed in the electrode made from the reactive conductive materials 504 and the non-reactive conductive material 505.

Furthermore, the insulator 801 is generated in the side surface of the reactive conductive materials 504 which underwent the chemical reaction, and the insulator 801 is not formed in the side surface of the non-reactive conductive material 505 which did not undergo the chemical reaction. In other words, the projection 804 is not coated by the insulator 801.

Specifically, in the method in the present invention, the forming of the electrode projection 804 and the selective insulator coating through the generation of the insulator 801 are performed at the same time, and the insulator 801 which is the insulation coating is formed on the portion other than the projection 804, and thus the positional relationship thereof is perfectly consistent.

(Controllability)

Next, the controllability of the projection 804 shall be described. In particular, the controlling of the recession amount 803 of the side surface of the reactive conductive material 504 shall be described.

The electrode projection 804 which is formed according to the present invention, is a thin plate, and the width of the projection matches the thickness of the non-reactive conductive material 505. Furthermore, the position at which the projection 804 is formed matches the position of the stacked non-reactive conductive material 505. Furthermore, the position at which the insulator 801, which is the insulation coating, is formed matches the position of the reactive conductive material 504.

In this manner, by stipulating the thickness of the respective layers of the reactive conductive material 504 and the non-reactive conductive material 505, it is possible to control the position and width of the electrode projection 804 and the insulator 801, which is the insulation coating, that are to be formed.

As previously described, the control for the thickness of the stacked film 506 configured of the reactive conductive materials 504 and the non-reactive conductive material 505 can be performed with nanometer precision by using sputtering, CVD, and so on. Therefore, by using the method in the present invention, the electrode projection 804 having a width of several nanometers, can be formed reproducibly and in a state where its position and width are controlled. Likewise, the insulator 801, which is the insulation coating, can also be formed by controlling the coating position.

The length (amount of projection) of the electrode projection 804 matches the recession amount 803 of the side surface of the reactive conductive material 504. The recession amount 803 of the side surface of the reactive conductive material 504 is proportional to the reaction amount in the insulating layer forming chemical reaction. For example, in the aluminum oxide generating chemical reaction in the oxidation of aluminum, for each unit volume of aluminum consumed, is 1.3 times as much of aluminum oxide is generated. Inversely, the side surface of the aluminum recedes by as much as approximately 0.8 times the amount of the aluminum oxide generated.

The insulating layer forming chemical reaction amount is a monotonically increasing function with respect to the chemical reaction time. Therefore, by controlling the chemical reaction time, the recession amount 803 of the side surface of the electrode projection 804 can be controlled. FIG. 7 shows the relationship between the chemical reaction time and the recession amount of the side surface of aluminum, at a substrate temperature of 550° C. and a plasma intensity of 400 W. For example, in order to cause the side surface of the aluminum to recede by 10 nanometers, that is, in order to form the electrode projection 804 having a length (amount of projection) of 10 nanometers, it is sufficient to perform processing for 8 minutes.

Unlike the CMP process which requires physical contact, a deposition process such as sputtering, an oxidation process using oxygen plasma, and so on, are processes through which uniformity within a wafer plane and inter-wafer reproducibility can easily be obtained. Therefore, with the method in the present invention, a minute projection and a partial insulation coating can be reproducibly formed.

In this manner, the present invention allows the length (amount of projection) of the projection to be reproducibly controlled by controlling the thickness of the reactive conductive material 504 and the non-reactive conductive material 505 and the process conditions and the time for the selective insulator forming process.

In this manner, as shown in FIG. 8A, after the selective insulator forming process is performed, deposition of the variable resistance film 901 is performed on the side surface of the stacked film 506 in which the projection 804 has been formed (step S108). $TiO_2$, NiO, $SrTiO_3$, $Cu_2O$, and so on, are known as materials for the variable resistance film 901 which functions as a ReRAM. In the present embodiment, there is no particular limitation on the selection of the material for the variable resistance film 901. Deposition of these materials of the variable resistance film 901 can be performed by sputtering, CVD, and so on.

Next, as shown in FIG. 8B, the deposition of the Pt 902 and the W 903, which are to become counter electrodes, is performed (step S109). As long as a material is an electrode material that exhibits good operation as a variable resistance memory (ReRAM), the present embodiment does not place any limitations on the selection of such material. For example, Pt and the like can be selected. Deposition of Pt is possible by sputtering, CVD, and so on. Furthermore, Pt may be provided only in the portion that is in contact with the variable resistance material, and behind that portion, a different metal material such as Al, Cu, tungsten (W), and so on, may be provided. FIG. 8B shows the case of filling in with the W 903 after the Pt 902 is deposited. By adopting such a configuration, the cost of materials can be reduced.

With the process described above, a skewered variable resistance memory in which a variable resistance film that is sandwiched between (i) plural electrodes, each of which has a projection in the electrode and has the portion other than the projection insulation-coated, and (ii) one counter electrode.

Figure 9:
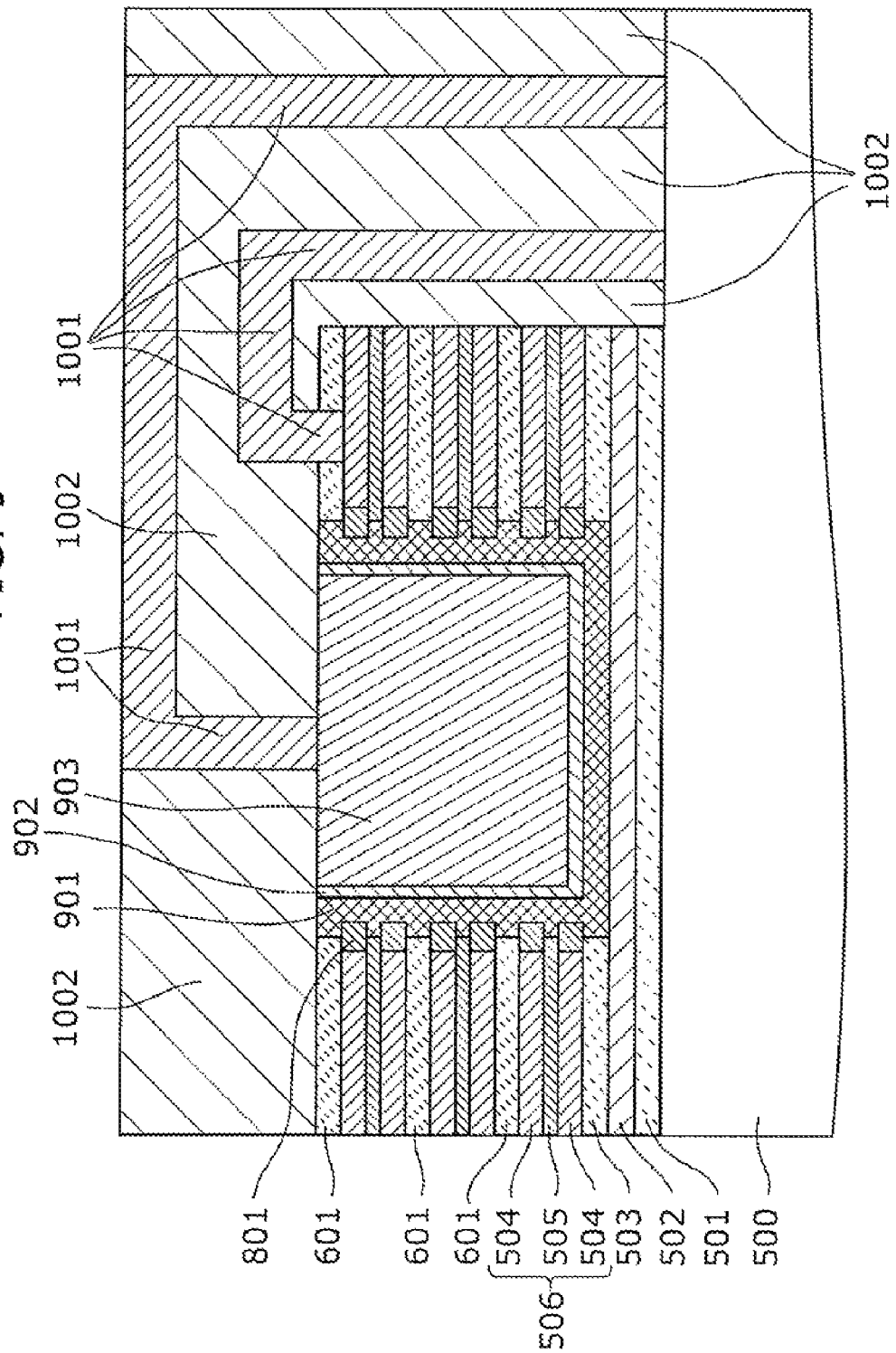
FIG. 9 is a diagram showing the manufacturing process of the memory cell according to Embodiment 1.

As shown in FIG. 9, the integrated memory is completed by forming insulating layers 1002 and wires 1001 on the completed memory cells, and connecting the wires 1001 to the drive circuit formed in the substrate 500 (step S110). The forming of the insulating layers 1002 can be performed through methods used in the usual semiconductor integrated circuit manufacturing, that is, oxide film deposition through the CVD method using TEOS, porous silica deposition through the sol-gel method, and so on. Furthermore, the forming of the wires 1001 can also be performed through methods used in the usual semiconductor integrated circuit manufacturing, that is, through the deposition of aluminum, copper, tungsten, and so on, by the sputtering method, CVD method, and so on. It should be noted that although the wiring for only one cell is illustrated in FIG. 9, obviously, wiring for every cell to be used may be performed.

Embodiment 2

Figure 10:
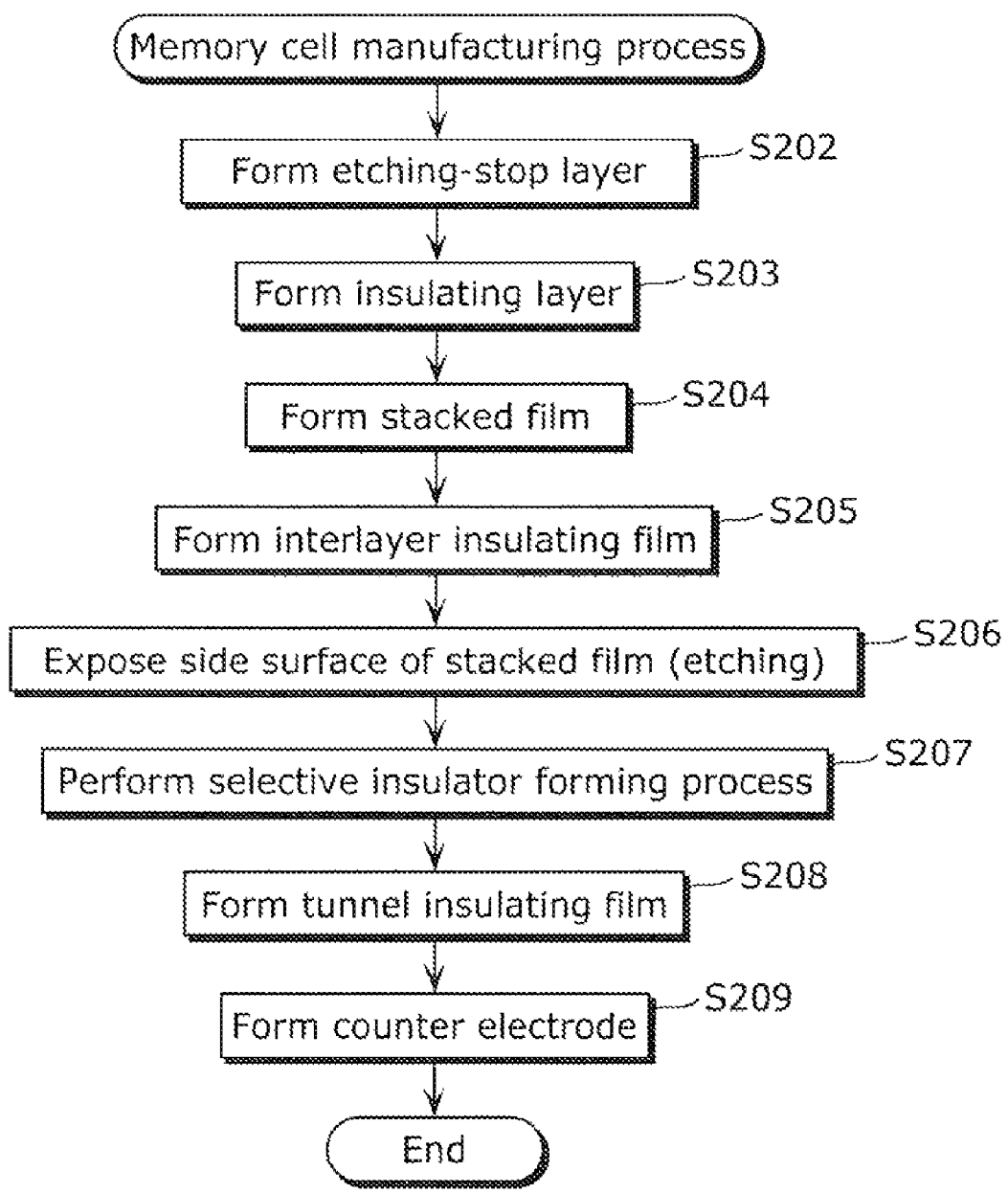
FIG. 10 is a flowchart for describing a manufacturing process of a memory cell according to Embodiment 2.

In Embodiment 2, the case of implementing the present invention in the forming of an MRAM shall be described using FIGS. 10 to 14. FIG. 10 is a flowchart for describing a manufacturing process of the memory cell of the MRAM, and FIGS. 11 to 14 are diagrams showing the manufacturing process of the memory cell. These diagrams are intended for showing the positional relationship of respective layers and thus thickness and length proportions are not uniform. Furthermore, although these diagrams show a cross-sectional view of the vicinity of one cell, in actuality, plural cells may be formed within the same substrate.

In the case of the MRAM, the cause for the occurrence of resistance change is not the change in the characteristics of the resistance, and so on, in the insulating film-side as in the ReRAM, but the change in the characteristics of the ferromagnet making up the electrodes formed on both upper and lower surfaces of a tunnel insulating film which is a semiconductor layer. For example, rewriting of information is performed by keeping the magnetic orientation of one of the electrodes fixed as a fixed-magnetization electrode, and reversing the magnetic orientation of the other electrode as a variable-magnetization electrode. Even in such a MRAM, it is advantageous to have a configuration of a memory cell in which a projection and an insulation coating are formed on the side surface of a stacked film serving as an electrode.

In a spin-injection MRAM, the resistance change of the tunnel insulating film occurs due to the angular momenta of electric charges passing through the electrode. At this time, the more the angular momenta of the electric charges passing though the electrode are uniform, the more likely magnetic reversal will occur in the electrode. Among the angular momenta, the orbital angular momentum component is different depending on which direction the electric charge moves. In an MRAM in which a tunnel insulating film that coats the electrode projection, the movement path of electric charges is limited to the linear direction connecting the projection of one electrode and the other electrode (counter electrode). As such, variation in the orbital angular momenta of the electric charges is suppressed, and thereby facilitating magnetic reversal. Hereinafter, the configuration and manufacturing method of an MRAM in the present embodiment shall be described.

Even in the case of an MRAM, drive circuits (semiconductor integrated circuits) for driving the cells are also required. Like the ReRAM, a memory cell and a drive circuit can be connected by wiring after being manufactured in separate substrates. However, integrating the memory cell and the drive circuit on the same substrate is advantageous in terms of performance and manufacturing efficiency. In the present embodiment, description is likewise carried out exemplifying the case of integration on the same substrate.

The drive circuit can be manufactured on a silicon substrate through a semiconductor integrated circuit process such as the usual CMOS process, and so on. The MRAM cell can be formed on an insulating layer deposited on a substrate in which the semiconductor is integrated circuit is formed. Obviously, the cell of the MRAM need not be stacked on the drive circuit. However, this stacking is preferable from the point of view of productivity. In view of this, the present embodiment describes the process portion of manufacturing the cell of the MRAM on an insulating film 1201, starting from the point when the insulating film 1201 is deposited on a substrate 1200 in which a drive circuit (semiconductor integrated circuit) has been formed, and the insulating film 1201 is planarized. Since the forming and planarization of the insulating layer 1201 is exactly the same as in the procedure described in Embodiment 1, description shall not be repeated.

Figure 11A:
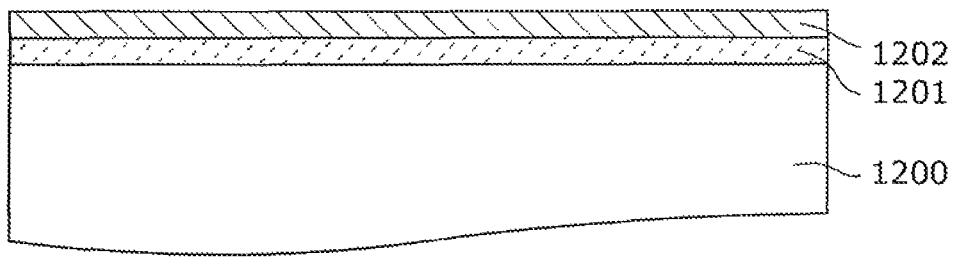
FIGS. 11A to 11C are diagrams showing the manufacturing process of the memory cell according to Embodiment 2.

First, as shown in FIG. 11A, an etching-stop layer 1202 is formed on the insulating layer 1201 formed on the substrate 1200 including the drive circuit (semiconductor circuit) (step S202). The etching-stop layer 1202 is a layer for stopping etching so that, in the subsequent dry etching, the etching does not reach up to the substrate 1200 and destroy even the semiconductor integrated circuit layer present therein, during the forming of the electrode of the MRAM. Here, in the same manner as Embodiment 1, description shall be carried out exemplifying the case where a silicon nitride film is used as the etching-stop layer 1202 and etching is stopped actively.

Figure 11B:
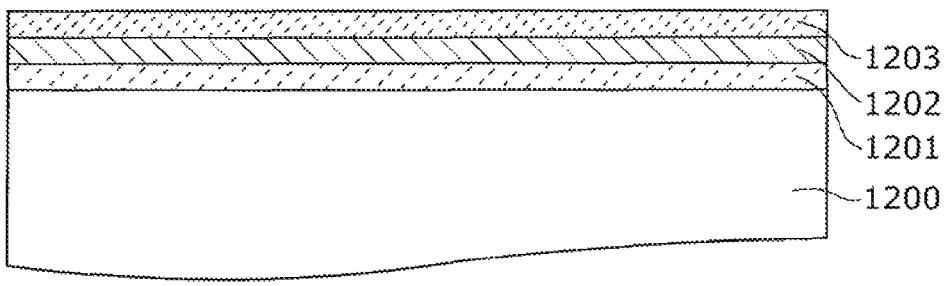

Next, as shown in FIG. 11B, an insulating layer 1203 is deposited using TEOS and so on, on the etching-stop layer 1202 (step S203). It should be noted that the insulating film 1203 on the etching-stop layer 1202 may be omitted when the etching-stop layer 1202 has good insulation properties.

Figure 11C:
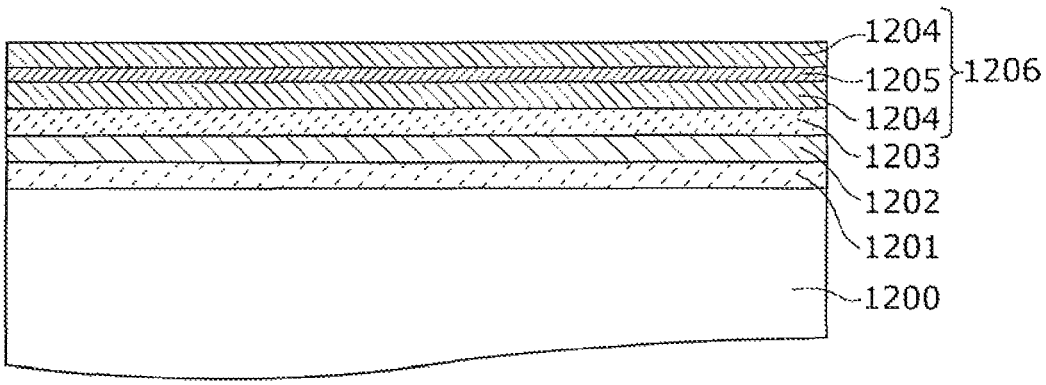

Next, as shown in FIG. 11C, a stacked film 1206 including at least two types of conductive materials is stacked on the insulating layer 1203 (step S204). The stacked film 1206 has a layered configuration including a reactive conductive material 1204 and a to non-reactive conductive material 1205. The reactive conductive material 1204 is a material that undergoes a chemical reaction and changes into an insulator in an oxidation process or nitridation process. The non-reactive conductive material 1205 is a material that does not undergo a chemical reaction and does not change into an insulator in the oxidation process or nitridation process.

At least one reactive conductive material 1204 is selected from materials which undergo a chemical reaction to form an insulator 1401 in a "selective insulator forming process" to be described later. Furthermore, at least one non-reactive conductive material 1205 is selected from materials which do not undergo the chemical reaction to form the insulator 1401 in same process. For example, when and oxidation process using oxygen plasma is selected as the selective insulator forming process, a material in which oxidation due to oxygen plasma progresses may be selected as the reactive conductive material 1204, and a material in which oxidation due to oxygen plasma does not progress may be selected as the non-reactive conductive material 1205. It should be noted that the reactive conductive material 1204 and the non-reactive conductive material 1205 to be stacked need not be of one type each, and may include, for example, three types of conductive materials with the reactive conductive material 1204 being made of two types and the non-reactive conductive material 1205 being made of one type.

The reactive conductive material 1204 is required to have three characteristics. The first is that (1) part of the reactive conductive material 1204 undergoes the chemical reaction to change into the insulator in the selective insulation forming process. The second is that, (2) the material is consumed in such chemical reaction, that is, part of the reactive conductive material 1204 changes into the insulator, and the volume of the reactive conductive material 1204 decreases. The third is that (3) the part of the reactive conductive material 504 that does not undergo a chemical reaction is electrically conductive. Even in the MRAM, aluminum can also be used, for example, in the same manner as the case of the ReRAM.

On the other hand, in order for the memory cell to operate as an MRAM, the non-reactive conductive material 1205 must have the properties of a ferromagnet, aside from the property of not undergoing the chemical reaction in the selective insulator forming process. Therefore, in this case, Pt cannot be used.

Although it is possible to select a material, like Pt, which is not prone to react chemically with oxygen in the first place, an alloy that has already reacted with oxygen, that is, an oxide, may be used. This is because the alloy has already reacted with oxygen, and thus reaction does not progress further even when the alloy is placed under an oxygen atmosphere.

A non-reactive conductive material 1205 made from an oxide can be easily found. Most manganese series oxides are suitable as a ferromagnetic electrode of the MRAM because they are strongly-correlated oxide ferromagnets that are highly spin polarized. $MnO_2$, $CaRuO_3/CaMnO_3$ superlattice, and so on, can be given as such a material. Aside from these, ferrites, such as $MnFe_2O_4$, which are widely used as magnets are also oxide ferromagnets.

In view of this, in the present embodiment, a method of implementing the present invention by using $MnO_2$ shall be described. In order to effectively obtain a current crowding effect, the thickness of the non-reactive conductive material 1205 needs to be suppressed. However, if the thickness is made too thin, there are cases where satisfactory properties as a ferromagnet cannot be obtained. Here, the case where the thickness of an $MnO_2$ layer is 20 nanometers shall be exemplified.

Since the reactive conductive material 1204 which undergoes a chemical reaction does not need to be a ferromagnet, the thickness thereof can be selected arbitrarily. Since this thickness is related to the electrical resistance of the cell as a whole, it is preferable that the thickness be kept to a few tens of nanometers or greater, and more preferably to 100 nanometers or greater.

It should be noted that the reactive conductive material 504 and the non-reactive conductive material 505 need not be one layer each, and may each be multiple layers. Exemplified here is the case of stacking 50 nanometers of aluminum as the reactive conductive material 1204, 20 nanometers of $MnO_2$ as the non-reactive conductive material 1205, and further on top of that, 50 nanometers of aluminum as reactive conductive material 504. Control for such a nanometer-level thickness can be easily implemented through a deposition process such as sputtering, CVD, and so on.

Figure 12A:
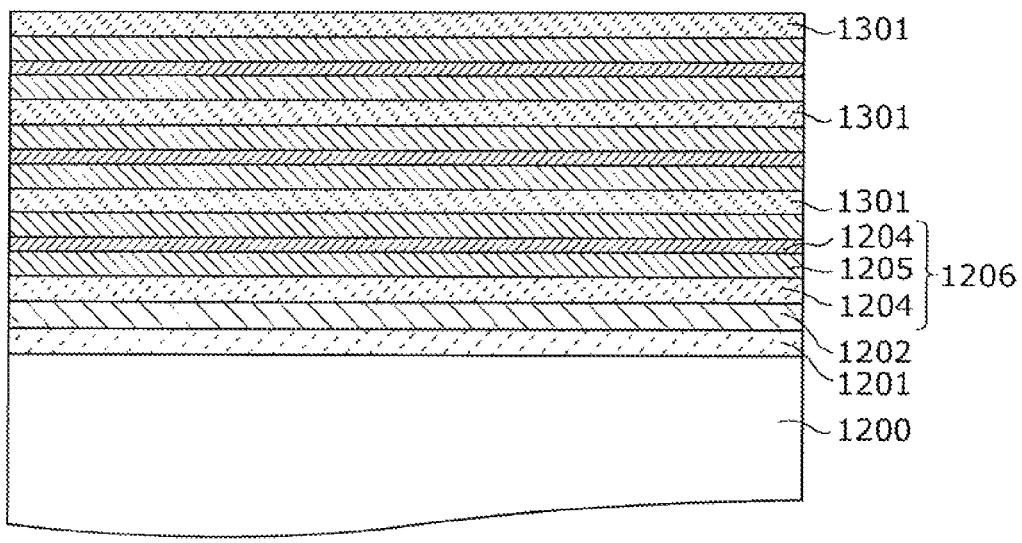
FIGS. 12A and 12B are diagrams showing the manufacturing process of the memory cell according to Embodiment 2.

Next, as shown in FIG. 12A, the interlayer insulating layer 1301 is deposited on the stacked film 1206 (the reactive conductive materials 1204 and the non-reactive conductive material 1205) (step S205). For example, approximately 100 nanometers of a silicon oxide layer is deposited using TEOS. The deposition of the stacked film 1206 (the reactive conductive materials 1204 and the non-reactive conductive material 1205) and the interlayer insulating layer 1301 is repeated as many times as the number of the cells to be stacked.

Figure 12B:
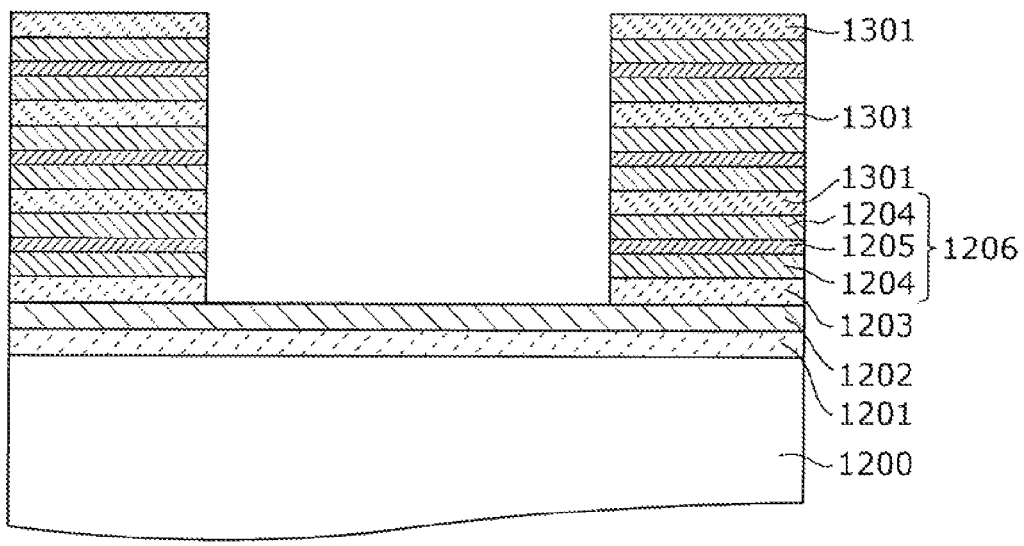

Next, etching is performed to expose the side surface of the stacked film 1206 (the reactive conductive materials 1204 and the non-reactive conductive material 1205) (step S206). As such, first, the portion on which etching is to be formed is defined by photolithography or electron beam lithography, and the like. Subsequently, as shown in FIG. 12B, dry etching or wet etching is performed so as to penetrate through the insulating layer 1203, the respective interlayer insulating layers 1301, and the respective reactive conductive materials 1204 and non-reactive conductive material 1205, to expose the side surface of the stacked film 1206 (the reactive conductive materials 1204 and the non-reactive conductive material 1205). In the present embodiment, the case of forming a hole by dry etching to expose the side surface of the stacked film 1206 (the reactive conductive materials 1204 and the non-reactive conductive material 1205) in the side wall inside the hole is exemplified. However, the side surface exposing method does not need to be implemented through the forming of a hole, and may be a method of forming a trench in the stacked film 1206 so as to expose the side surface of the stacked film as the side walls of the trench, and may be a method of performing etching to leave behind the stacked film 1206 in a column-shape to expose the side surface of the stacked film 1206.

As shown in FIG. 12C, according to this hole forming process, the side surface of the stacked film 1206 (the reactive conductive materials 1204 and the non-reactive conductive material 1205) that is stacked is exposed at the side wall of the hole. It should be noted that FIG. 12B illustrates a cross-section of one hole, and that, in actuality, the stacked film to the left of the figure and the stacked film to the right are continuous.

Figure 13A:
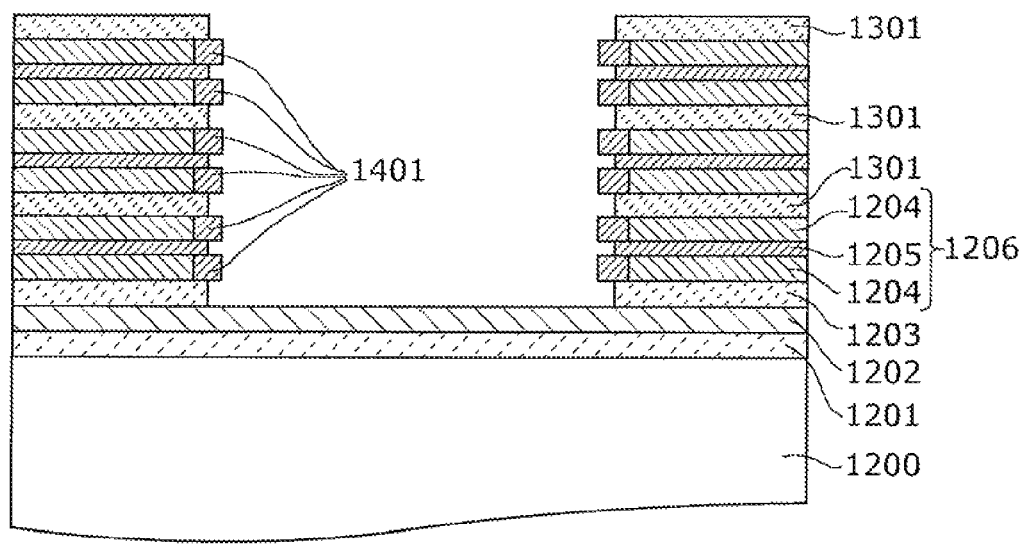
FIGS. 13A and 13B are diagrams showing the manufacturing process of the memory cell according to Embodiment 2.

Next, as shown in FIG. 13A, the selective insulator forming process is performed (step S207). In the same manner as in Embodiment 1, the "selective insulator forming process" is a process in which, out of the reactive conductive materials 1204 and the non-reactive conductive material 1205 that are stacked, the reactive conductive materials 1204 form the insulators 1401 on its side surfaces through chemical reaction, and the non-reactive conductive material 1205 does not undergo the chemical reaction to form the insulator 1401. Specifically, the insulators 1401 are selectively formed on the side surfaces of the reactive conductive materials 1204.

As in Embodiment 1, the case of using oxygen plasma treatment shall be exemplified here. It should be noted that, since aluminum is used as the material which undergoes a chemical reaction, in the same manner as in Embodiment 1, the recession amount, and so on, with respect to the process time is the same. For example, in order to cause a recession of 10 nanometers, it is sufficient to perform processing for 8 minutes using oxygen plasma treatment at a substrate temperature of 550° C., a frequency of 13.56 MHz and a radio frequency intensity of 400 W.

Like in Embodiment 1, in Embodiment 2, the non-reactive conductive material 1205 may make use of a non-oxidizing material or a material that is already oxidized such that oxidation reaction does not progress any further.

Since the side surface of the reactive conductive material 1204 which undergoes the chemical reaction recedes and the side surface of the non-reactive conductive material 1205 which does not undergo the chemical reaction does not recede when the selective insulator forming process is performed on the stacked film 1206, the side surface of the non-reactive conductive material 1205 projects outward, thereby forming a projection.

In other words, in this process, a projection is formed in the electrode made from the reactive conductive material 1204 and the non-reactive conductive material 1205.

Furthermore, the insulator 1401 is generated in the side surface of the reactive conductive material 1204 which underwent the chemical reaction, and the insulator 1401 is not generated in the side surface of the non-reactive conductive material 1205 which did not undergo the chemical reaction. Specifically, at the same time as the forming of the projection, the insulation-coating of the portion other than the electrode is also performed, and the projection formed in the non-reactive conductive material 1205 is not coated with the insulator 1401.

In the same manner as Embodiment 1, the projection formed in the present embodiment has a side surface that is coated with the insulator 1401, and the side surface of the reactive conductive material 1204 is recessed compared to the side surface of the non-reactive conductive material 1205.

Figure 13B:
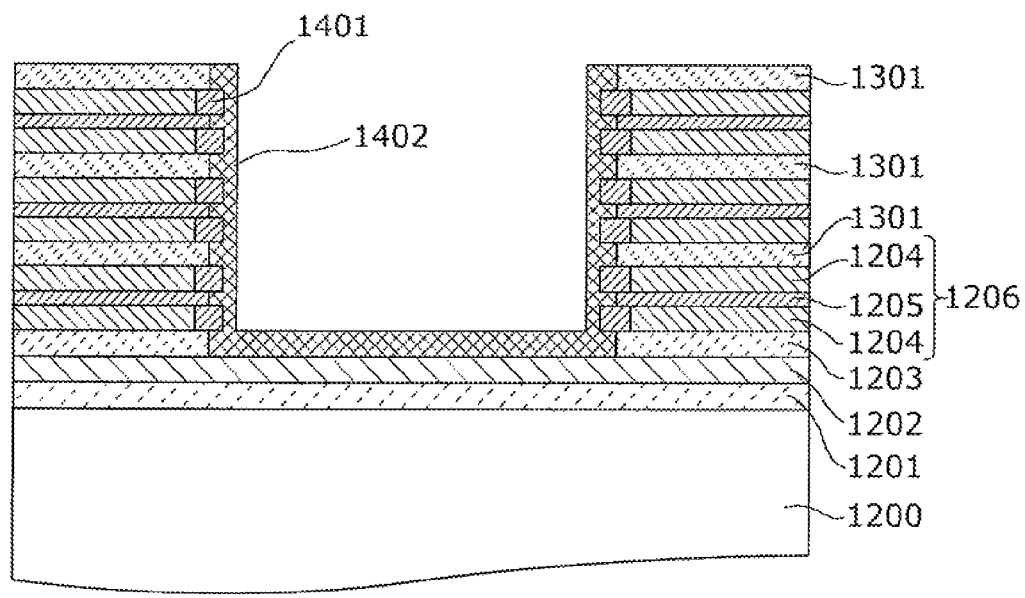

In this manner, after the selective insulator forming process is performed on the exposed side surface of the stacked film 1206, deposition of the tunnel insulating film 1402 is performed as shown in FIG. 13B (step S208). For example, MgO can be used as the tunnel insulating film 1402. The thickness of the tunnel insulating film 1402 is set at approximately 1 nanometer so as to sufficiently allow for the occurrence of the tunneling phenomenon. These insulating films can be formed by MBE, sputtering, and so on.

Figure 14:
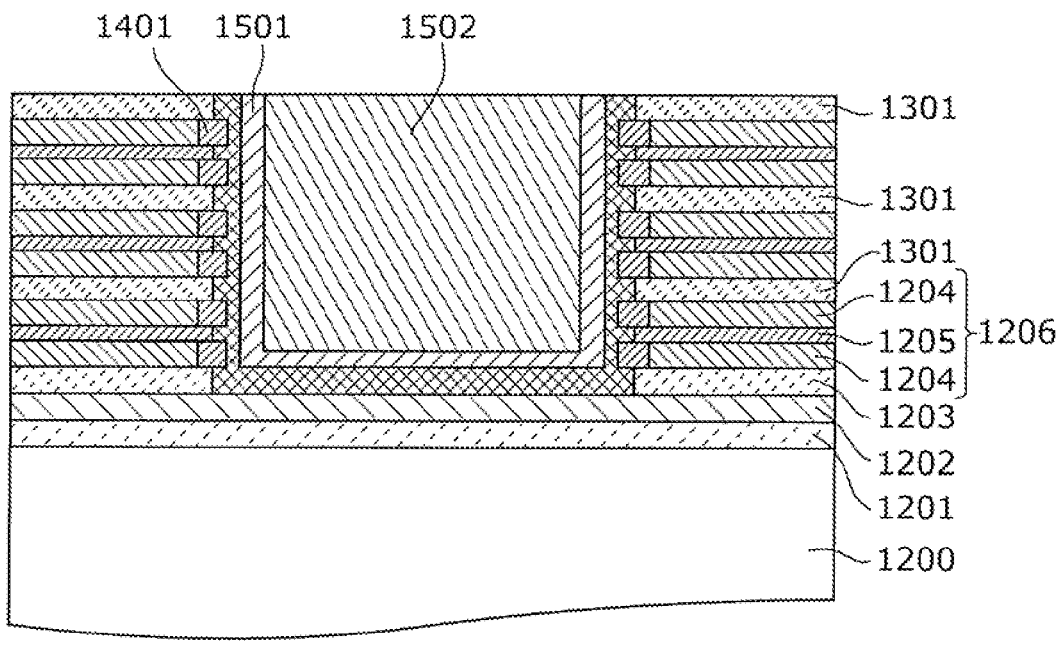
FIG. 14 is a diagram showing the manufacturing process of the memory cell according to Embodiment 2.

Next, as shown in FIG. 14, the deposition of counter electrodes is performed (step S209). In order to function as an MRAM, the counter electrodes need to be ferromagnets.

However, this counter electrode can be selected from arbitrary ferromagnets since it will not undergo the selective insulator forming process. For example, a material, such as Fe or CoFe, which oxidizes under an oxygen atmosphere may be selected. Here, the case of CoFe shall be exemplified. Deposition of CoFe is possible through MBE or sputtering. Furthermore, a ferromagnet may be provided only in the portion that is in contact with the tunnel insulating film 1402, and behind that portion, a different nonmagnetic metal material such as Al, Cu, W, and so on, may be provided. FIG. 14 shows the case where implanting of W 1502 is performed after CoFe 1501 is deposited.

With the processes up to this point, an MRAM memory cell in which the tunnel insulating film 1402 is sandwiched between the stacked film 1206 and the CoFe 1501 which is a counter electrode made from a ferromagnet is completed. In order to use this cell as an integrated memory, it is necessary to subsequently perform the wiring process and so on. However, since these are processes performed for the common semiconductor circuit, their description shall be omitted as in Embodiment 1.

Embodiment 3

Figure 15:
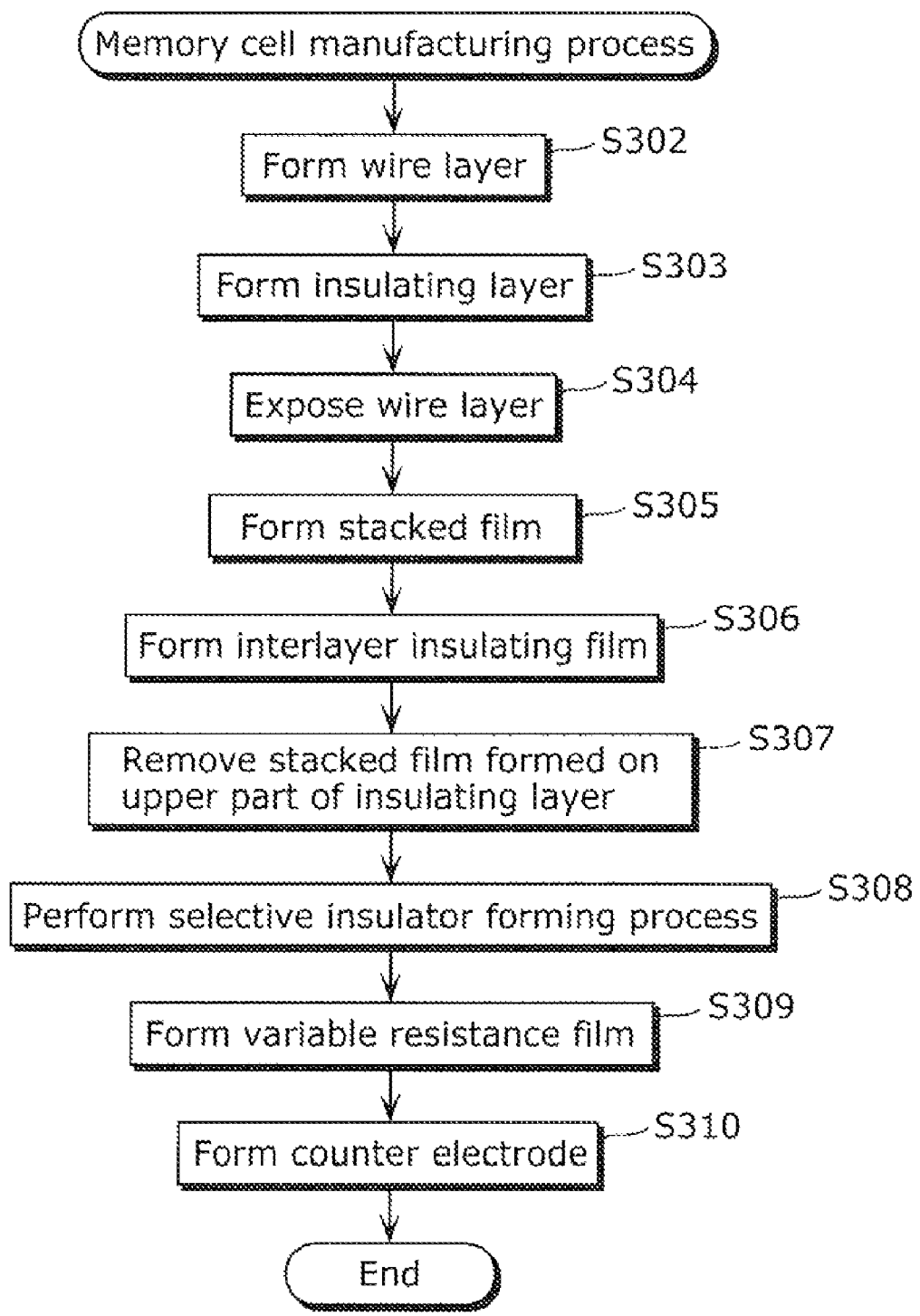
FIG. 15 is a flowchart for describing a manufacturing process of a memory cell according to Embodiment 3.

In Embodiment 3, the case of an ReRAM having a cell format in which an electrode and a variable resistance film are stacked in a perpendicular direction with respect to the substrate, and plural memories are formed in a planar manner shall be described using FIGS. 15 to 20. FIG. 15 is a flowchart for describing a manufacturing process of a memory cell of the ReRAM, and FIGS. 16 to 20 are diagrams showing the manufacturing process of the memory cell. These diagrams are also intended for showing the positional relationship of respective layers and thus thickness and length proportions are not uniform. Furthermore, although these diagrams show a cross-sectional view of the vicinity of one cell, in actuality, plural cells may be formed within the same substrate.

Figure 16A:
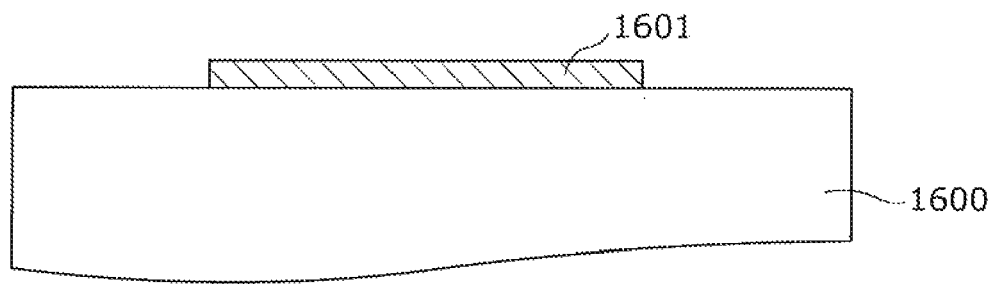
FIGS. 16A to 16C are diagrams showing the manufacturing process of the memory cell according to Embodiment 3.

This cell format also requires drive circuits (semiconductor integrated circuits) for cell driving, and it is preferable that these drive circuits be manufactured on the semiconductor substrate before hand using a CMOS process, and the like, prior to the ReRAM cell forming process. Furthermore, in the present embodiment, connection wiring between these drive circuits and the respective cells of the ReRAM is required. Here, as shown in FIG. 16A, a process starting from the stage (step S302) in which a wire layer 1601 is formed on a substrate 1600 in which a semiconductor circuit is already formed shall be described. Up to this point, manufacturing is possible using the usual semiconductor process. It should be noted that the present embodiment is possible regardless of the positional relationship between the drive circuit and the cell, and their manufacturing sequence.

Figure 16B:
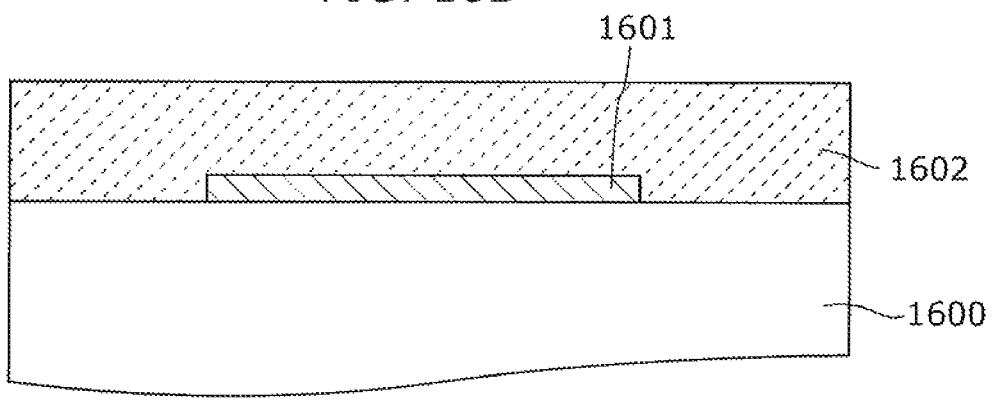

First, as shown in FIG. 16B, deposition of an insulating layer 1602 is performed (step S303). The insulating material for the insulating layer 1602 may be the material used in the interlayer insulating film in the usual semiconductor process. For example, a silicon oxide film manufactured using TEOS and the like is acceptable. The thickness of the insulating layer 1602 needs to be greater than the thickness in the deposition of stacked film 1706 to be performed later. Here, the case of depositing 300 nanometers shall be exemplified.

Figure 16C:
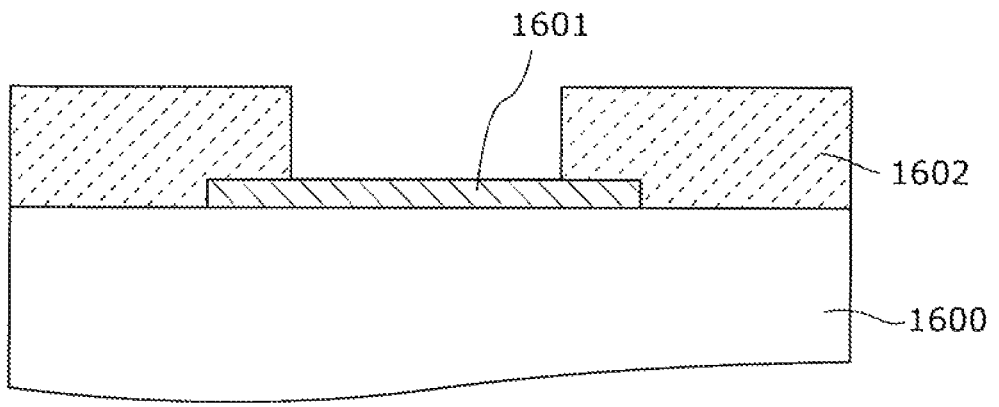

Next, as shown in FIG. 16C, the portion of the insulating layer 1602 in which the cell of the ReRAM shall be formed is removed by photolithography and dry etching. Specifically, as shown in FIG. 16C, a hole is formed in a part of the insulating layer 1602 such that the underlying wire layer 1601 is exposed and a structure in which the exposed portions of the insulating layer 1602 and wire layer 1601 are in contact (step S304). A configuration is achieved in which the wire layer 1601 is disposed in the portion corresponding to the bottom plane of the hole, and the insulating layer 1602 is disposed in the portion corresponding to the side wall of the hole.

FIG. 16C shows the case where the etching area is a square-shape that is narrower than the wire layer 1601 as seen from the top surface of the insulating layer 1602, and the entire side wall of the hole formed in the insulating layer 1602 is in contact with the exposed portion of the wire layer 1601. Specifically, FIG. 16C is a cross-sectional view cut across the hole in the insulating layer 1602, and the insulating layer 1602 in the left and right are actually a continuous insulating layer 1602.

It should be noted that the shape as seen from the top surface in the etching process for exposing the wire layer 1601 is not an its essential item to the present embodiment. The entire side wall of the insulating layer 1602 need not be in contact with the wire layer 1601, and it is sufficient, for example, to perform the etching of the insulating layer 1602 in a long trench shape such that just one plane of the side walls of the insulating layer 1602 is in contact with the wire layer 1601.

Figure 17A:
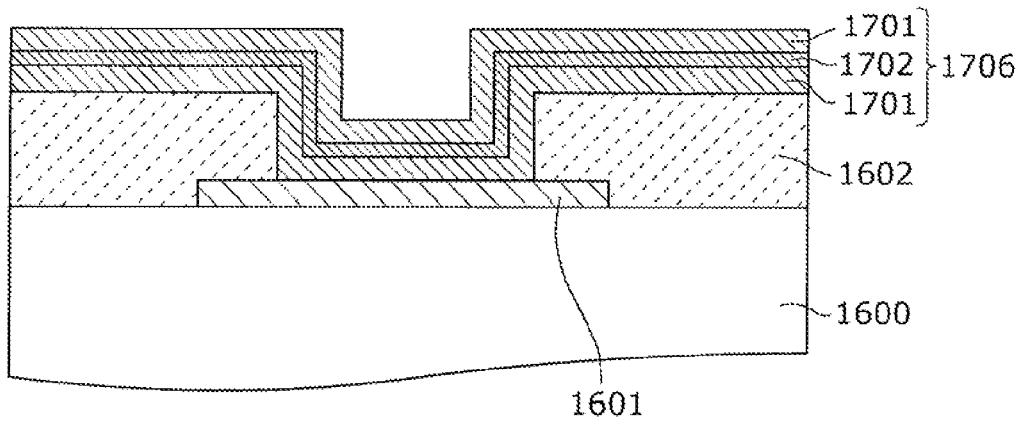
FIGS. 17A to 17C are diagrams showing the manufacturing process of the memory cell according to Embodiment 3.

Next, as shown in FIG. 17A, the stacked film 1706, which includes at least two types of conductive materials, is stacked on the top surface of the insulating layer 1602 in which a hole has been formed and on the side wall of the hole (step S305). The stacked film 1706 has a layered configuration including a reactive conductive material 1701 and a non-reactive conductive material 1702. The reactive conductive material 1701 is a material that undergoes a chemical reaction and changes into an insulator in an oxidation process or nitridation process. The non-reactive conductive material 1702 is a material that does not undergo a chemical reaction and does not change into an insulator in the oxidation process or nitridation process.

At least one reactive conductive material 1701 is selected from materials which undergo a chemical reaction to form an insulator 1801 in a "selective insulator forming process" to be described later. Furthermore, at least one non-reactive conductive material 1702 is selected from materials which do not undergo the chemical reaction to form the insulator 1801 in the same process. For example, when oxidation process using oxygen plasma is selected as the selective insulator forming process, a material in which oxidation due to oxygen plasma progresses may be selected as the reactive conductive material 1701, and a material in which oxidation due to oxygen plasma does not progress may be selected as the non-reactive conductive material 1205. It should be noted that the reactive conductive material 1701 and the non-reactive conductive material 1702 to be stacked need not be of one type each, and may include, for example, three types of conductive materials with the reactive conductive material 1701 being made of two types of conductive materials and the non-reactive conductive material 1702 being made of one type of conductive material.

Exemplified here is the case of stacking 50 nanometers of aluminum as the reactive conductive material 1701, 5 nanometers of Pt as the non-reactive conductive material 1702, and further on top of that, 50 nanometers of aluminum as the reactive conductive material 1701.

Deposition of these reactive conductive materials 1701 and the non-reactive conductive material 1702 is performed by sputtering, MBE, CVD, and the like. However, deposition of the reactive conductive materials 1701 and the non-reactive conductive material 1702 shall also be performed on the side wall of the hole formed in the insulating layer 1602. The deposition of the reactive conductive materials 1701 and the non-reactive conductive material 1702 on the side wall of the hole formed in the insulating layer 1602 is a technique that is also widely used in the usual semiconductor process, such as barrier metal deposition, and so on. With this deposition, the stacked film 1706 (the reactive conductive materials 1701 and the non-reactive conductive material 1702) is formed continuously on the exposed wire layer 1601, on the side wall of the hole formed in the insulating layer 1602, and on the upper part of the insulating layer 1602.

Figure 17B:
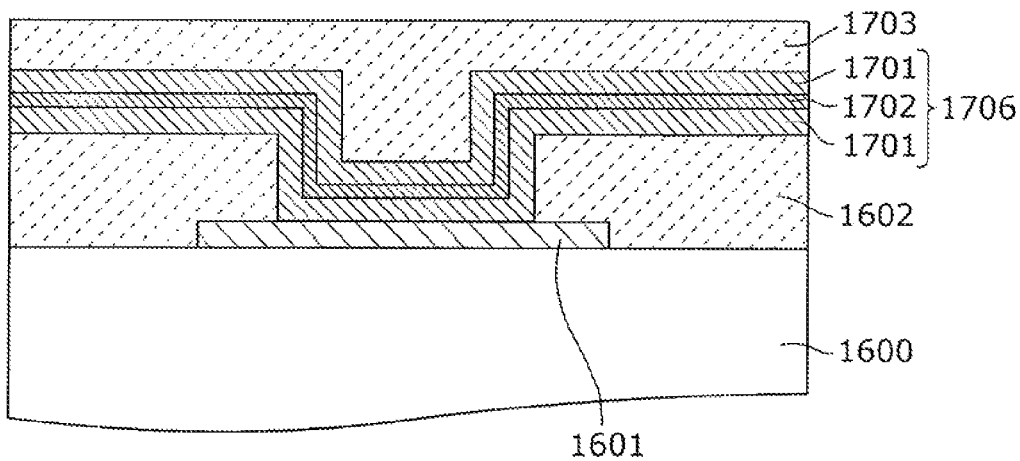

Next, as shown in FIG. 17B, the deposition of an interlayer insulating film 1703 is performed (step S306). The interlayer insulating film 1703 may be of a typical insulating film material. Specifically, the interlayer insulating film may be of a silicon oxide film using TEOS, and may be of a low-dielectric material such as porous silica manufactured through the sol-gel method, and so on. The thickness of the interlayer insulating film 1703 is selected such that depressions present on top of the stacked film 1706 (the reactive conductive materials 1701 and the non-reactive conductive material 1702) deposited on the hole in the insulating layer 1602 are completely buried. In other words, a thickness that is sufficiently greater than the depth of the depressions is selected.

Figure 17C:
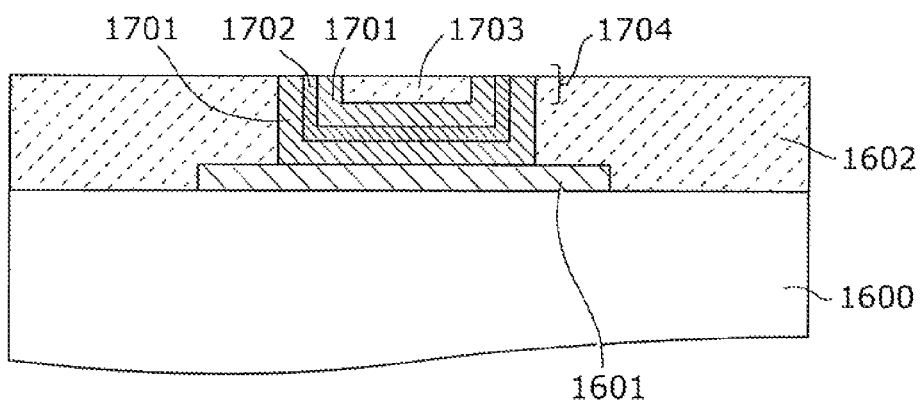

Next, removal of the interlayer insulating film 1703 is performed by a process such as CMP, and the like, until the portion of the stacked film 1706 (the reactive conductive materials 1701 and the non-reactive conductive material 1702) that is formed on the upper part of the insulating layer 1602 is exposed. Next, as shown in FIG. 17C, out of the stacked film 1706 (the reactive conductive materials 1701 and the non-reactive conductive material 1702), the portion formed above the insulating layer 1602 is removed by CMP or dry etching (step S307). Specifically, as shown in FIG. 17C, part of the stacked film 1706 is removed so that the stacked film 1706 that is stacked on the side wall of the hole forms one plane with the top surface of the insulating film 1602.

At this point in time, the stacked film 1706 (the reactive conductive materials 1701 and the non-reactive conductive material 1702) having a bent shape following the contour of the side walls and bottom plane of the insulating layer 1602 is formed in the hole in the insulating layer 1602. From here on, the bent portion in this bent shape, as shown in FIG. 17C, shall be called a large projection 1704. The large projection 1704 is embedded between the insulating layer 1602 and the interlayer insulating film 1703 and is in a state in which the side surface of the stacked film 1706, that is, the surface having the layered structure in which the reactive conductive materials 1701 and the non-reactive conductive material 1702 are stacked, is exposed as one plane with the top surface of the insulating layer 1602.

Figure 18:
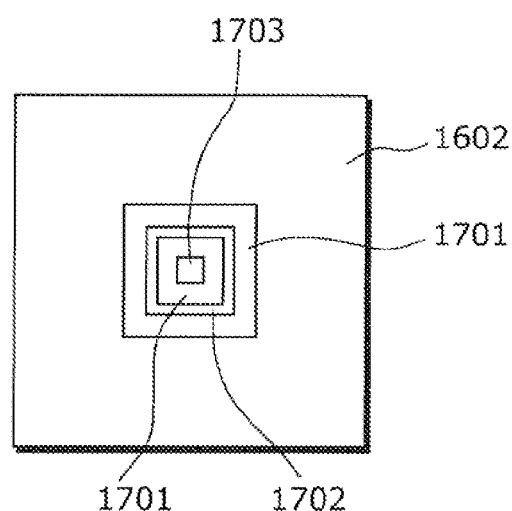
FIG. 18 is a top view showing the exposed side surface of a stacked film according to Embodiment 3.

FIG. 18 is a top view showing the exposed side surface of the stacked film 1706. As shown in FIG. 18, for example, when seen from the top surface, the exposed side surface of the stacked film 1706 forms a square shape in which the reactive conductive materials 1701 which undergo the chemical reaction and the non-reactive conductive material 1702 which does not undergo the chemical reaction are nested. However, the shape seen from the top is not an essential item to the present invention, and may be a shape other than a square, depending on the shape of the hole formed in the insulating layer 1602 prior to the deposition of the reactive conductive materials 1701 and the non-reactive conductive material 1702. An essential item in the present embodiment is that the side surfaces of the reactive conductive materials 1701 and the non-reactive conductive material 1702 are both exposed by the etching.

Figure 19A:
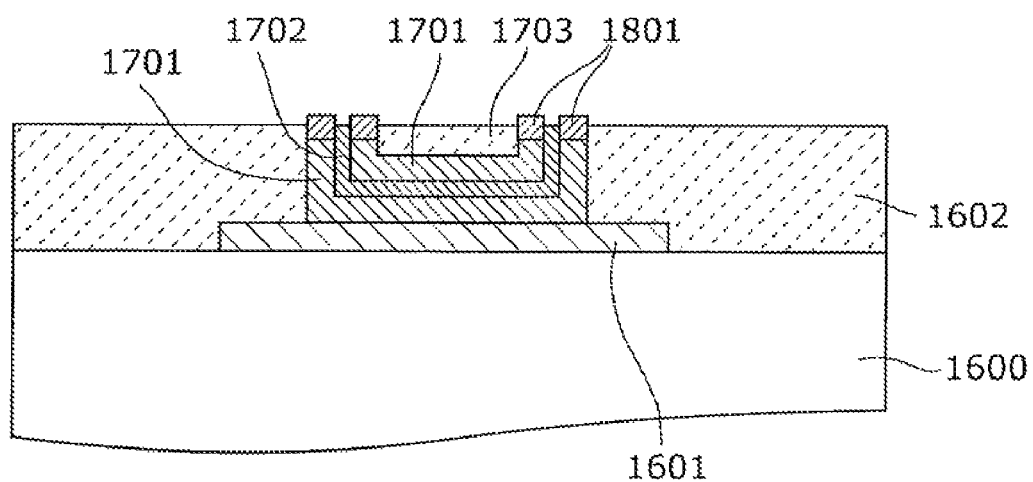
FIGS. 19A and 19B are diagrams showing the manufacturing process of the memory cell according to Embodiment 3.

Next, as shown in FIG. 19A, the selective insulator forming process is performed on the side surface of the large projection 1704 (the reactive conductive materials 1701 and the non-reactive conductive material 1702). The elements required in the selective insulator forming process are the same as in Embodiment 1. Here, the case of performing oxygen plasma treatment shall be exemplified. The condition required in order to cause the side surface of the aluminum to recede by 10 nanometers is the same as in Embodiment 1. In other words, 8 minutes in the case of oxygen plasma treatment at a substrate temperature of 550° C., a frequency of 13.56 MHz, and an intensity of 400 W.

Figure 19B:
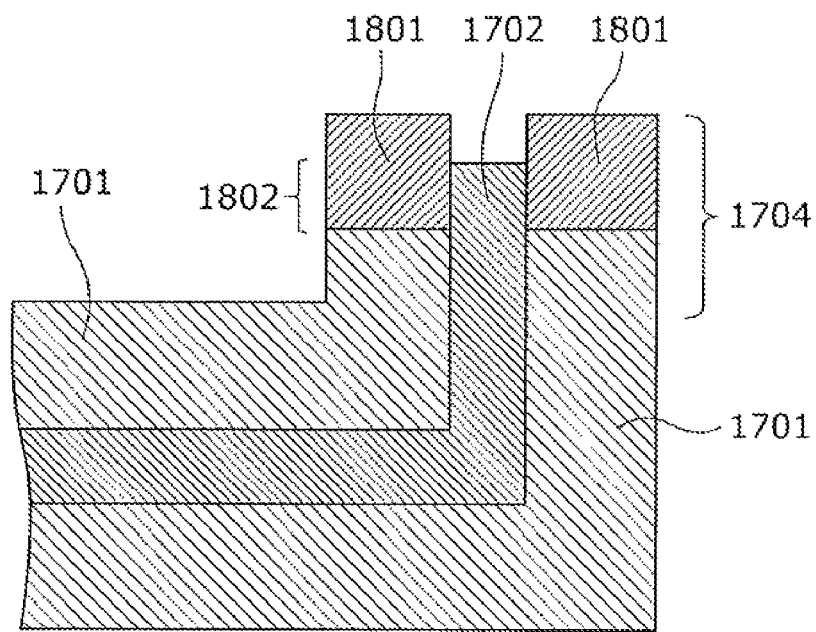

According to this process, out of the exposed side surface of the large projection 1704 (the reactive conductive materials 1701 and the non-reactive conductive material 1702), part of the side surface of the reactive conductive materials 1701 changes into the insulator 1801 while the side surface of the reactive conductive materials 1701 recedes due to the chemical reaction, as shown in FIG. 19B. On the other hand, since a chemical reaction does not occur with the non-reactive conductive material 1702, side surface recession does not occur and the side surface of the non-reactive conductive material 1702 remains exposed.

With this selective insulator forming process, a projection 1802 which is the non-reactive conductive material 1702 that projects outward more than the reactive conductive materials 1701 is formed, and at the same time, the portion other than the projection 1802 is insulation-coated by the insulator 1801. From here on, the projection 1802 generated by the selective insulator forming process shall be called small projection 1802.

Figure 20A:
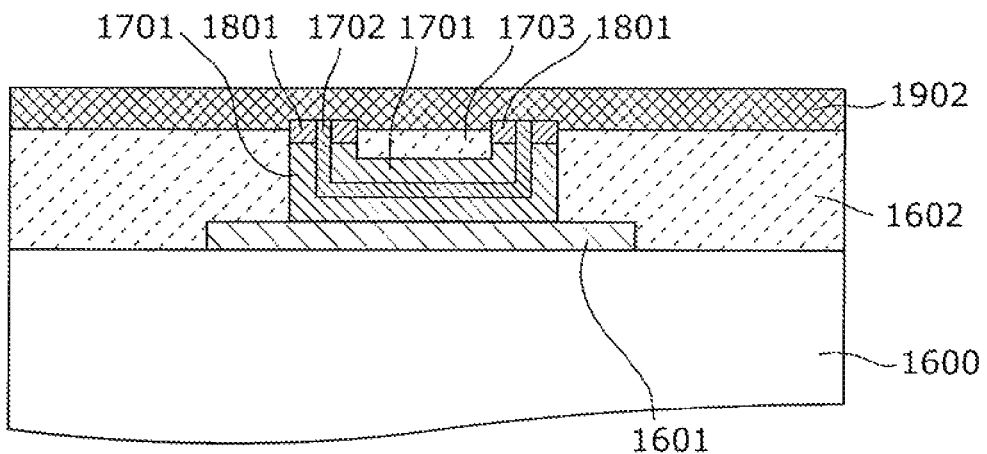
FIGS. 20A to 20C are diagrams showing the manufacturing process of the memory cell according to Embodiment 3.

Next, as shown in FIG. 20A, deposition of a variable resistance film 1902 is performed (step S309). The present invention does not place any particular limitations on the selection of the type of the variable resistance film 1902. For example, $TiO_2$ can be used. Deposition thereof can be performed by sputtering or CVD.

Figure 20B:
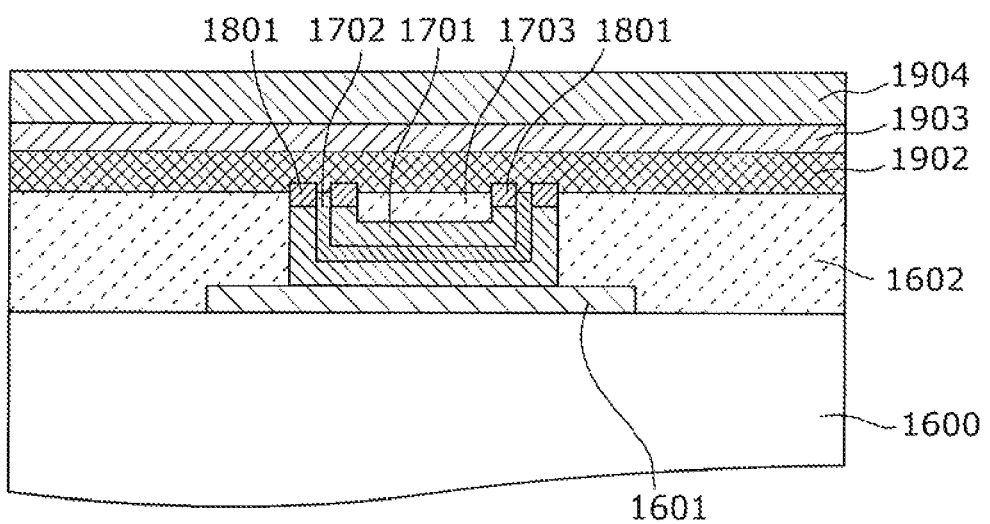
Figure 20C:
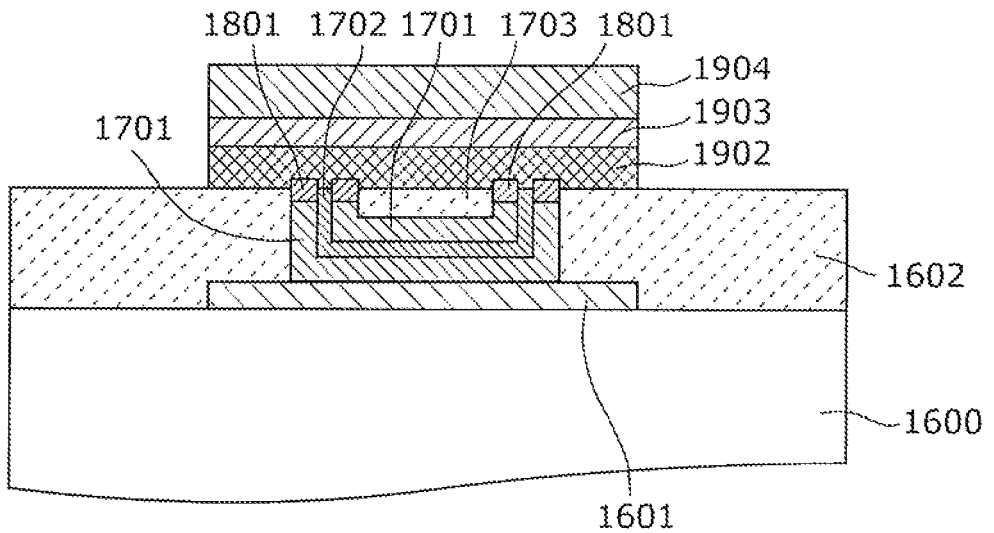
Figure 21:
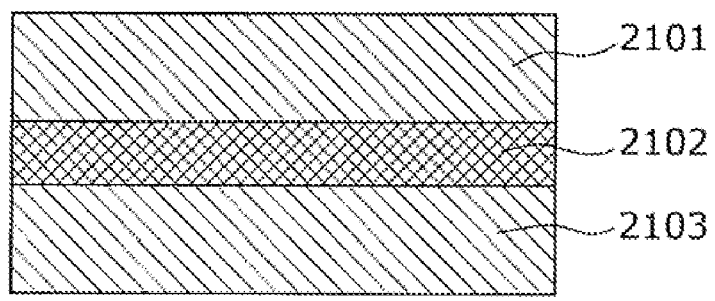
FIG. 21 is an outline structure diagram showing a structure of an ReRAM according to a conventional technique.
Figure 22:
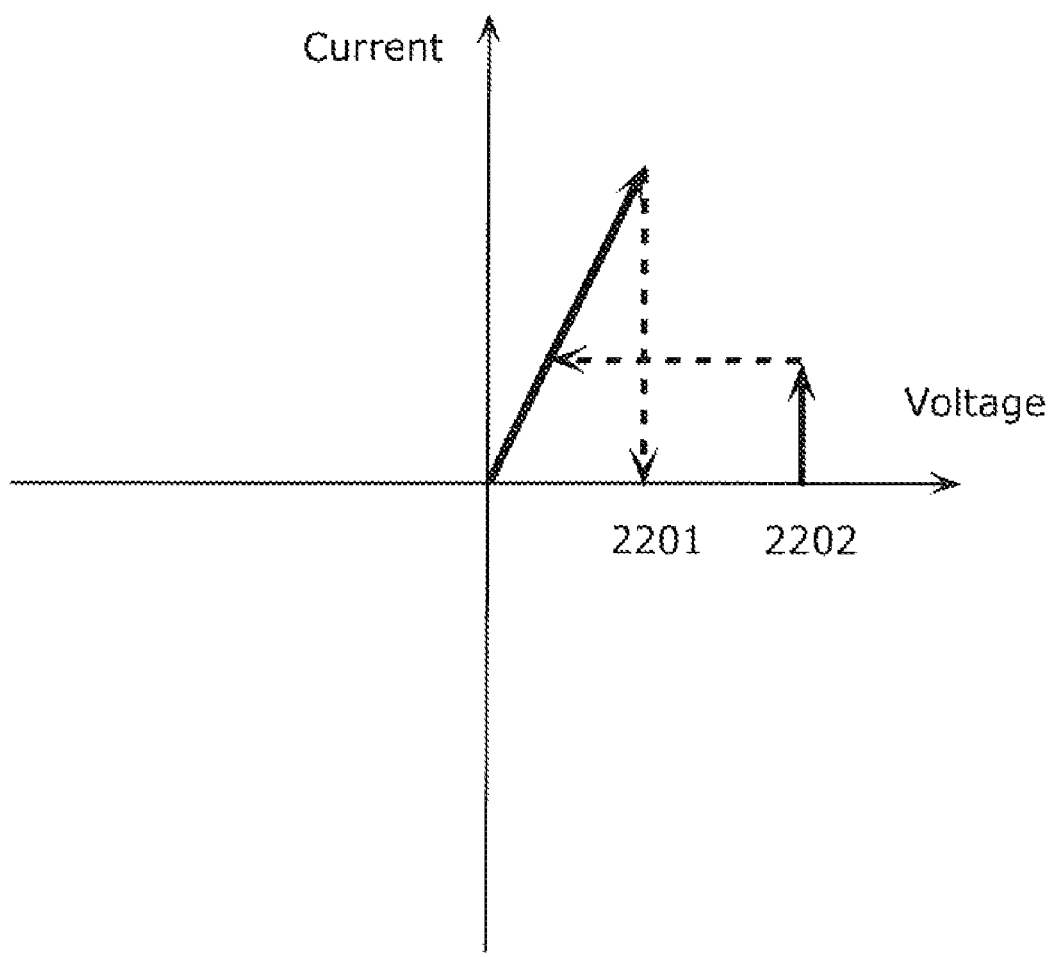
FIG. 22 is a graph showing operational characteristics of a non-polar ReRAM according to the conventional technique.
Figure 23:
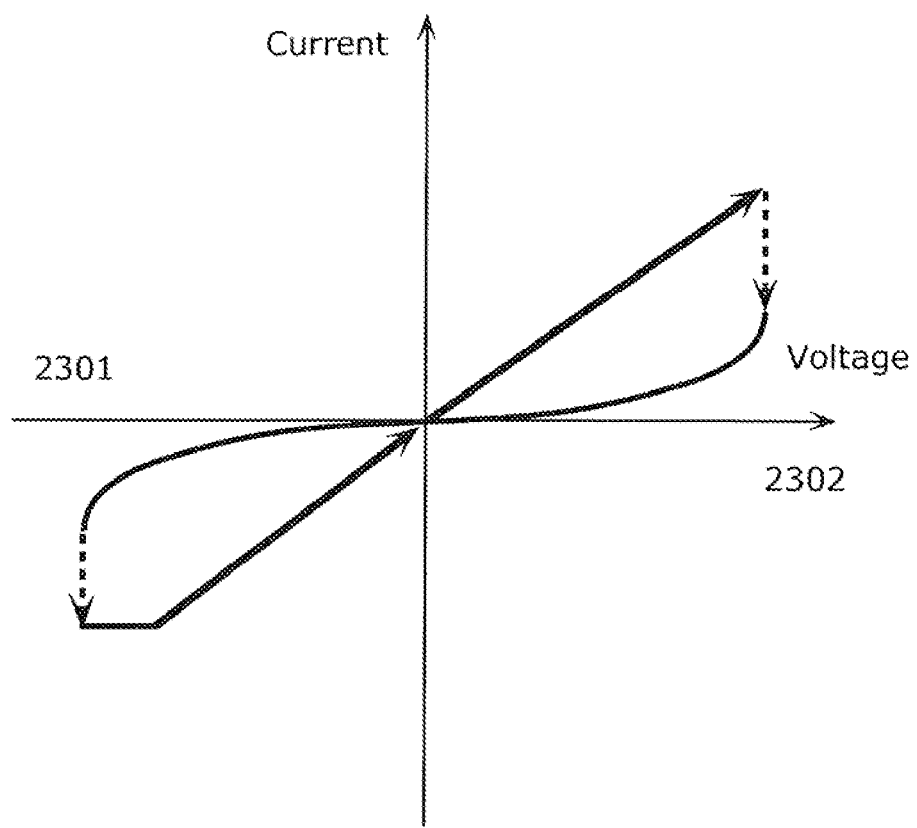
FIG. 23 is a graph showing operational characteristics of a bipolar ReRAM according to the conventional technique.
Figure 24:
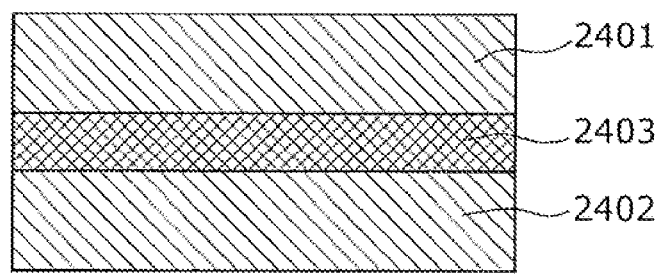
FIG. 24 is a diagram showing a structure of an MRAM according to the conventional technique.

Next, as shown in FIG. 20B, deposition of counter electrodes is performed (step S310). The present invention does not place any particular limitations on the selection for the counter electrodes. For example, Pt can be used, and a multilayered structure can be adopted by depositing Al after stacking the Pt. FIG. 20B illustrates a structure in which Al 1904 is stacked after Pt 1903 is stacked. Up to this point, the electrode/variable resistance film/electrode structure, which is the basic structure of the memory cell of the ReRAM, is formed. Subsequently, as shown in FIG. 20C, the ReRAM integrated circuit is completed when separation according to the etching for the respective cells, wire formation, and so on, are performed. Since the process for wiring and so on is the same as that for the usual semiconductor integrated circuit manufacturing process, description shall be omitted.

The present embodiment is similar to the method in Patent Reference 4. However, the most significant difference is that only the equivalent of the large projection 1704 of the present embodiment is formed in the method in Patent Reference 4, whereas the small projection 1802 is formed at the tip of the large projection 1704 in the present embodiment. When only the large projection 1704 is formed, the electric charge crowding effect, and so on, is determined by the shape of the large projection 1704. However, when both the large projection 1704 and the small projection 1802 are formed as in the present embodiment, the electric charge crowding effect is determined by the shape of the small projection 1802 which has a smaller curvature radius, that is, a narrower projection width, and is no longer dependent on the shape of the large projection 1704.

The resistance value of the entire electrode is determined by the sum of the electrical resistance of the small projection 1802 and the electrical resistance of the large projection 1704. Since the small projection 1802 has a narrower width than the large projection 1704, the electrical resistance per projection length (amount of projection) is high. However, in order to obtain the electric charge crowding effect, it is sufficient that the length of the small projection 1802 be approximately twice the width thereof or approximately 10 nanometers. With the present embodiment, the length (amount of projection) of the small projection 1802 can be controlled precisely. Therefore, by suppressing the length (amount of projection), the absolute value of the resistance value can be suppressed.

In the present embodiment, the insulator 1801 is formed on the side surface of the reactive conductive materials 1701 which compose part of the large projection 1704, and thus the part of the large projection 1704 corresponding to the reactive conductive materials 1701 do not directly come in contact with the variable resistance material and the width thereof does not affect the electric charge crowding effect. Specifically, in the present invention, the part of the reactive conductive materials 1701 out of the large projection 1704 does not manifest an effect as a projection, and the reactive conductive materials 1701 in effect play the role of a wire to the small projection 1802. As such, the selection of the width and material of the large projection 1704 can be performed independently of the electric charge crowding effect of the small projection 1802 and memory operation as an ReRAM. Specifically, the per-unit-length electrical resistance of the large projection 1704 can be suppressed by increasing the thickness of the reactive conductive materials 1701 or using the variable resistance material.

For example, take into consideration the case where the small projection 1802 is formed from Pt having a rectangular column-shape with a long-side length of 50 nanometers, a thickness (width) of 5 nanometers and a length (amount of projection) of 10 nanometers, and the large projection 1704 is formed in a rectangular column-shape from a layered material of aluminum with a long-side length of 50 nanometers and a thickness (width) of 100 nanometers and Pt with a long-side length of 50 nanometers and a thickness (width) of 5 nanometers.

The electrical resistance of the small projection 1802 is 0.98 Ω and the electrical resistance of the large projection 1704 is 0.012 Ω per 10 nanometers of length (amount of projection). When the length (amount of projection) of the large projection 1704 is 50 nanometers, the overall electrical resistance value for the combined small projection 1802 and large projection 1704 is 1.0Ω. In contrast, when there is no large projection 1704 and there is only the small projection 1802 with a length (amount of projection) of 50 nanometers, the electrical resistance value becomes 5.9Ω. In other words, with the combination of the large projection 1704 and the small projection 1802, it is possible to reduce electrical resistance to ⅕ or less while obtaining the same electric charge crowding effect.

Suppressing the per-unit-length electrical resistance of the large projection 1704 is also useful in suppressing electrical resistance variation. In terms of the characteristics of the process used, the length variation in the large projection 1704 is greater compared to that in the small projection 1802 which allows precise length control. However, when the per-unit-length electrical resistance is low, the electrical resistance variation generated due to the length variation can be kept low.

In the case of the large projection 1704 having the layered structure exemplified above, even a length (amount of projection) variation of 10 nanometers results in only a variation of 0.012Ω in the electrical resistance value. On the other hand, in the case of the small projection 1802, a length (amount of projection) variation of 10 nanometers results in a variation of 0.98Ω in terms of electrical resistance. The value of the resistance variation of the large projection 1704 can be further reduced by increasing the thickness of the reactive conductive materials 1701 or using a material with an even lower resistivity. Therefore, according to the present embodiment, by suppressing the per-unit-length electrical resistance of the large projection 1704, it is possible to reduce the effect on electrical resistance variation of the length (amount of projection) variation of the large projection 1704 for which length variation suppression is difficult in terms of process.

In this manner, with the present embodiment, the projection curvature radius, specifically, the projection width and electrical resistance can be independently set. Furthermore, the problem of the electrical variation of the large projection can be avoided.

It should be noted that the materials, and thicknesses illustrated in the above-described embodiments are merely examples and the implementation of the present invention is not limited to such materials and thicknesses, and various improvements and modifications can be carried within the scope of the essence of the present invention.

For example, the reactive conductive material in the ReRAM is not limited to the aluminum illustrated in the above-described embodiments, and may be a single metal such as copper or magnesium, or an alloy including aluminum, copper, magnesium, and so on, or single-crystalline silicon or polycrystalline silicon doped with these alloys.

Furthermore, the non-reactive conductive material in the ReRAM is not limited to the Pt illustrated in the above-described embodiments, and may be a material that is not prone to oxidation, such as gold or silver. Furthermore, the non-reactive conductive material may be ruthenium, zinc, tin, titanium, and so on, and an oxide conductor such as ruthenium oxide, zinc oxide, tin oxide, titanium oxide, indium-tin-oxide, and so on can also be used.

Furthermore, the selective insulator forming process is not limited to oxygen plasma treatment, and may be another method which is performed in combination with the same material as that in the oxygen plasma treatment, such as heat treatment under an oxygen atmosphere, contact processing using a liquid oxidizing agent, ozone exposure, and so on. Furthermore, the chemical reaction is not limited to oxidation, and may also be nitridation. For example, since aluminum forms an insulating layer of aluminum nitride through a chemical reaction with nitrogen, and Pt does not chemically combine with nitrogen, the oxygen plasma treatment may be replaced with nitride plasma treatment.

Furthermore, although Embodiment 3 describes the case where, in the ReRAM, the electrode and the variable resistance film are formed in the perpendicular direction with respect to the substrate, it should be easily understood that, by combining Embodiment 2 and Embodiment 3, it is possible to adopt a configuration where, even in a spin-injection MRAM, the electrode and the tunnel insulating film are formed in a perpendicular direction with respect to the substrate.

It should be noted that, aside from an ReRAM and spin-injection MRAM, the present invention is also useful as a method of manufacturing an electrode of an electron element in which voltage is applied and current is caused to flow between electrodes. The present invention can also be applied as a method of manufacturing an electrode for an electron-emitting source used in a field-emission display device, an electron beam microscope, and so on, for example.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

INDUSTRIAL APPLICABILITY

The method in the present invention is useful as a method of manufacturing an electrode which realizes the lowering of power consumption and suppression of characteristics variation in a storage element in which a change of state is caused by applying a voltage and causing current to flow between electrodes, such as in an ReRAM and spin-injection MRAM.

What is claimed is:

1. A method of manufacturing a semiconductor memory, the method comprising:
   forming a stacked film above a substrate by stacking a reactive conductive material and a non-reactive conductive material;
   exposing a side surface of the stacked film;
   forming a projection by performing an insulator forming process on the reactive conductive material and the non-reactive conductive material on the exposed side surface of the stacked film to cause a predetermined length of a side surface of the reactive conductive material to change into an insulator such that a side surface of the non-reactive conductive material projects from the side surface of the reactive conductive material;
   forming a semiconductor layer covering the insulator and the projection; and
   forming a counter electrode covering the semiconductor layer,
   wherein the insulator forming process is:
   (i) an oxidation process which is one of oxygen plasma treatment, heat treatment under an oxygen atmosphere, contact processing using liquid oxidizing, and ozone exposure; or
   (ii) a nitridation process which is nitride plasma treatment,
   wherein the reactive conductive material is a material that undergoes a chemical reaction and changes into the insulator in the oxidation process or the nitride plasma treatment,
   wherein the non-reactive conductive material is a material that does not change into the insulator in the oxidation process or the nitride plasma treatment,
   wherein the reactive conductive material is:
   (i) at least one metal from among aluminum, copper, and magnesium;
   (ii) an alloy including at least one of aluminum, copper, and magnesium; or
   (iii) at least one of single-crystalline silicon or polycrystalline silicon that is doped with the alloy, and
   wherein the non-reactive conductive material is at least one of platinum, gold, and silver.

2. The method according to claim 1, further comprising, prior to said forming of a stacked film:
   forming an insulating layer on the substrate; and
   forming an etching-stop layer on the insulating layer,
   wherein, in said forming of a stacked film, the stacked film is formed above the etching-stop layer,
   in said exposing of a side surface of the stacked film, the side surface of the stacked film is exposed by forming a hole from a top surface of the stacked film up to the etching-stop layer.

3. The method according to claim 1, further comprising, prior to said forming of a stacked film:
   forming a wire layer on the substrate;
   forming an insulating layer on the wire layer; and
   forming a hole from a top surface of the insulating layer up to the wire layer,
   wherein, in said forming of a stacked film, the stacked film is formed on a portion of the wire layer which corresponds to a bottom plane of the hole, a portion of the insulating layer which corresponds to a side wall of the hole, and the top surface of the insulating layer, and
   in said exposing of the side surface of the stacked film, part of the stacked film is removed by etching so as to expose the side surface of the stacked film formed on the portion of the insulating layer corresponding to the side wall of the hole.

4. The method according to claim 1, wherein the stacked film has a trilayer structure in which one of the reactive conductive material and the non-reactive conductive material is formed on both upper and lower surfaces of the other of the reactive conductive material and the non-reactive conductive material.

5. The method according to claim 1, wherein the semiconductor layer is a variable resistance film.

6. The method according to claim 1, wherein the semiconductor layer is a tunnel insulating film, and the counter electrode is a ferromagnet.

7. The method according to claim 1, wherein the insulator forming process is contact processing using a liquid oxidizing agent or nitrogen plasma treatment.

8. The method of claim 1, wherein the reactive conductive material is:
   (i) at least one metal from among aluminum, copper, and magnesium; or
   (ii) an alloy including at least one of aluminum, copper, and magnesium.

9. The method of claim 1, wherein the reactive conductive material is at least one metal from among aluminum, copper, and magnesium.

10. The method of claim 1, wherein the reactive conductive material is an alloy including at least one of aluminum, copper, and magnesium.

11. The method of claim 1, wherein the insulator forming process is the oxidation process which is one of oxygen plasma treatment, heat treatment under an oxygen atmosphere, contact processing using liquid oxidizing, and ozone exposure.

12. The method of claim 1, wherein the insulator forming process is the nitride plasma treatment.

13. The method of claim 1, wherein the side surface of the non-reactive conductive material projects from the side surface of the reactive conductive material in a first direction, and a side surface of the insulator projects from the side surface of the non-reactive conductive material in the first direction.

* * * * *